United States Patent
Yang et al.

(10) Patent No.: US 12,266,542 B2
(45) Date of Patent: *Apr. 1, 2025

(54) ATOMIC LAYER ETCHING FOR SUBTRACTIVE METAL ETCH

(71) Applicant: Lam Research Corporation, Fremont, CA (US)

(72) Inventors: Wenbing Yang, Campbell, CA (US); Mohand Brouri, Brussels (BE); Samantha SiamHwa Tan, Newark, CA (US); Shih-Ked Lee, Fremont, CA (US); Yiwen Fan, Fremont, CA (US); Wook Choi, San Jose, CA (US); Tamal Mukherjee, Beaverton, OR (US); Ran Lin, Fremont, CA (US); Yang Pan, Los Altos, CA (US)

(73) Assignee: Lam Research Corpporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/435,244

(22) Filed: Feb. 7, 2024

(65) Prior Publication Data

US 2024/0186150 A1 Jun. 6, 2024

Related U.S. Application Data

(63) Continuation of application No. 17/600,999, filed as application No. PCT/US2020/030054 on Apr. 27, 2020, now Pat. No. 11,935,758.

(Continued)

(51) Int. Cl.
*H01L 21/3213* (2006.01)

(52) U.S. Cl.
CPC .. *H01L 21/32139* (2013.01); *H01L 21/32136* (2013.01)

(58) Field of Classification Search
None
See application file for complete search history.

(56) References Cited

U.S. PATENT DOCUMENTS

| 5,236,550 A | 8/1993 | Abt et al. |
| 9,972,504 B2 | 5/2018 | Lai et al. |

(Continued)

FOREIGN PATENT DOCUMENTS

| JP | 2017-063186 | 3/2017 |
| KR | 10-2017-0017789 | 2/2017 |
| KR | 10-2017-0022922 | 3/2017 |

OTHER PUBLICATIONS

International Search Report from International Application No. PCT/US2020/030054 dated Aug. 14, 2020.

(Continued)

*Primary Examiner* — Stephanie P Duclair
(74) *Attorney, Agent, or Firm* — Beyer Law Gorup LLP

(57) ABSTRACT

A method for atomic layer etching a metal containing layer is provided. At least a region of a surface of the metal containing layer is modified to form a modified metal containing region by exposing a surface of the metal containing layer to a modification gas, wherein adjacent to the modified metal containing region remains an unmodified metal containing region. The modified metal containing region is selectively removed with respect to the unmodified metal containing region by exposing the surface of the metal containing layer to an inert bombardment plasma generated from an inert gas.

9 Claims, 15 Drawing Sheets

471a

471b

471c

471d

471e

472a

472b

472c

472d

472e

Related U.S. Application Data

(60) Provisional application No. 62/840,253, filed on Apr. 29, 2019.

(56)  References Cited

U.S. PATENT DOCUMENTS

| | | |
|---|---|---|
| 10,096,487 B2 | 10/2018 | Yang et al. |
| 2011/0139748 A1 | 6/2011 | Donnelly et al. |
| 2015/0132971 A1 | 5/2015 | Lin et al. |
| 2015/0228495 A1 | 8/2015 | Joubert et al. |
| 2015/0262829 A1 | 9/2015 | Park et al. |
| 2017/0040214 A1 | 2/2017 | Lai et al. |
| 2017/0053810 A1 | 2/2017 | Yang et al. |
| 2017/0069462 A1 | 3/2017 | Kanarik et al. |
| 2017/0229311 A1 | 8/2017 | Tan et al. |
| 2018/0138054 A1 | 5/2018 | Romero |
| 2018/0174860 A1 | 6/2018 | Kanarik |
| 2018/0337090 A1 | 11/2018 | Shen et al. |
| 2019/0108982 A1 | 4/2019 | Yang et al. |
| 2022/0199422 A1 | 6/2022 | Yang et al. |

OTHER PUBLICATIONS

Written Opinion from International Application No. PCT/US2020/030054 dated Aug. 14, 2020.
Office Action from U.S. Appl. No. 17/600,999 dated Feb. 16, 2023.
Final Office Action from U.S. Appl. No. 17/600,999 dated Aug. 29, 2023.
Notice of Allowance from U.S. Appl. No. 17/600,999 dated Nov. 16, 2023.
Korean Office Action from Korean Application No. 10-2021-7038917, May 27, 2024 with Machine Translation.

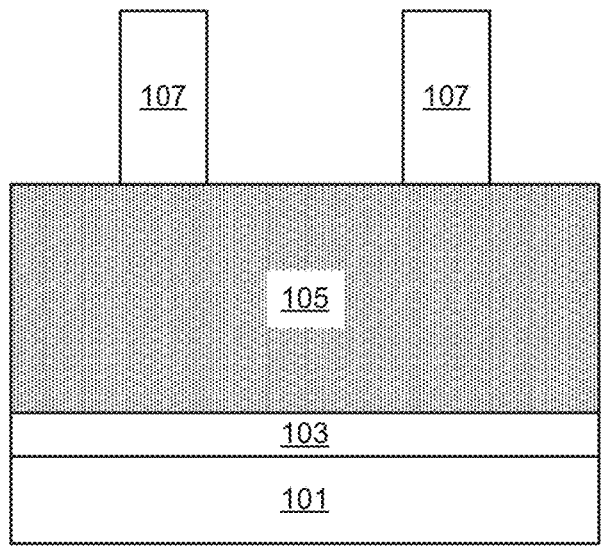
FIG. 1
(PRIOR ART)
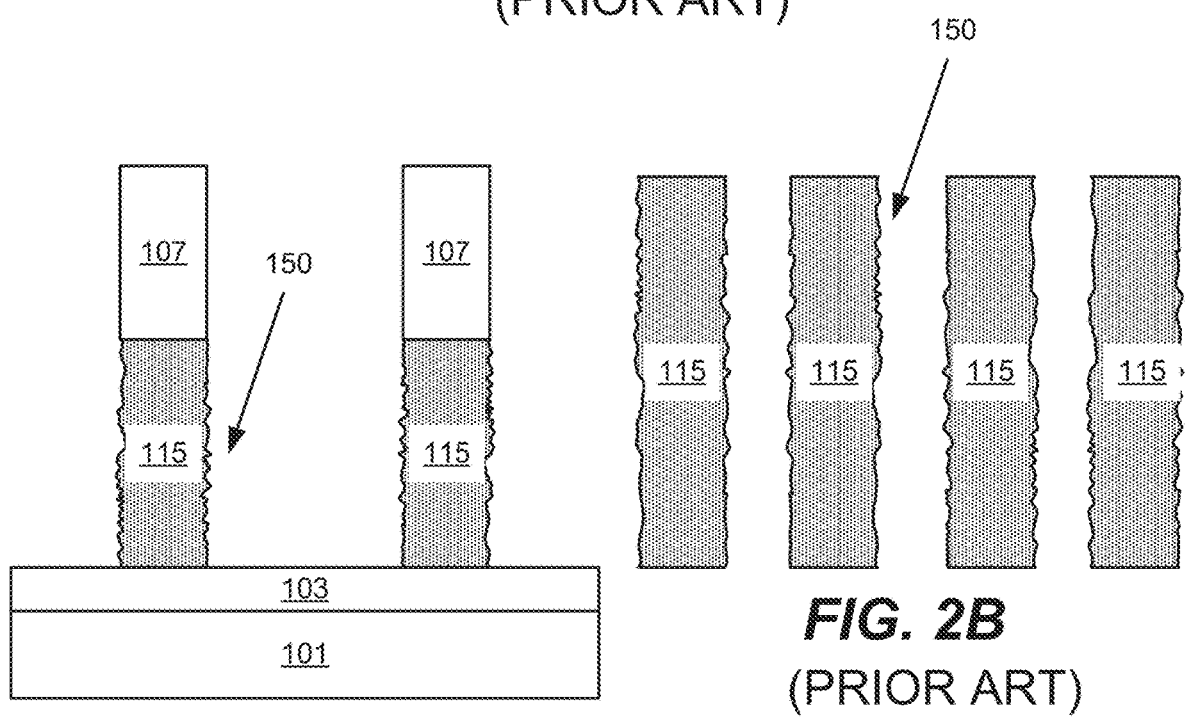
FIG. 2A
(PRIOR ART)
FIG. 2B
(PRIOR ART)

ATOMIC LAYER ETCHING FOR SUBTRACTIVE METAL ETCH

CROSS-REFERENCE TO RELATED APPLICATION

This application is a continuation of U.S. application Ser. No. 17/600,999 filed on Oct. 1, 2021, which is a 371 of international Application No. PCT/US2020/030054 filed on Apr. 27, 2020, which claims the benefit of U.S. Provisional App. No. 62/840,253, filed on Apr. 29, 2019, which is incorporated herein by reference for all purposes.

BACKGROUND

Semiconductor fabrication processes often involve the formation of metal-containing structures including logic and memory. Subtractive etching processes have been used to fabricate aluminum-containing structures, and as the industry shifted towards the use of copper, the Damascene processing scheme was created to accommodate for the difficulty of etching copper in subtractive etching processes. However, as devices shrink, it becomes increasingly difficult to form small copper features using the damascene process.

Other metals such as molybdenum (Mo) or ruthenium (Ru) may be used in such small features. Etching of such metals may have problems where wider features may etch faster than narrower features and sidewalls of metal features may be too rough.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

To achieve the foregoing and in accordance with the purpose of the present disclosure, a method for atomic layer etching a metal containing layer is provided. At least a region of a surface of the metal containing layer is modified to form a modified metal containing region by exposing a surface of the metal containing layer to a modification gas, wherein adjacent to the modified metal containing region remains an unmodified metal containing region. The modified metal containing region is selectively removed with respect to the unmodified metal containing region by exposing the surface of the metal containing layer to an inert bombardment plasma generated from an inert gas.

These and other features of the present disclosure will be described in more detail below in the detailed description of the disclosure and in conjunction with the following figures.

BRIEF DESCRIPTION OF THE DRAWINGS

FIGS. 1, 2A, and 2B are schematic illustrations of example substrates undergoing etching processes.

DETAILED DESCRIPTION

Figure 3:
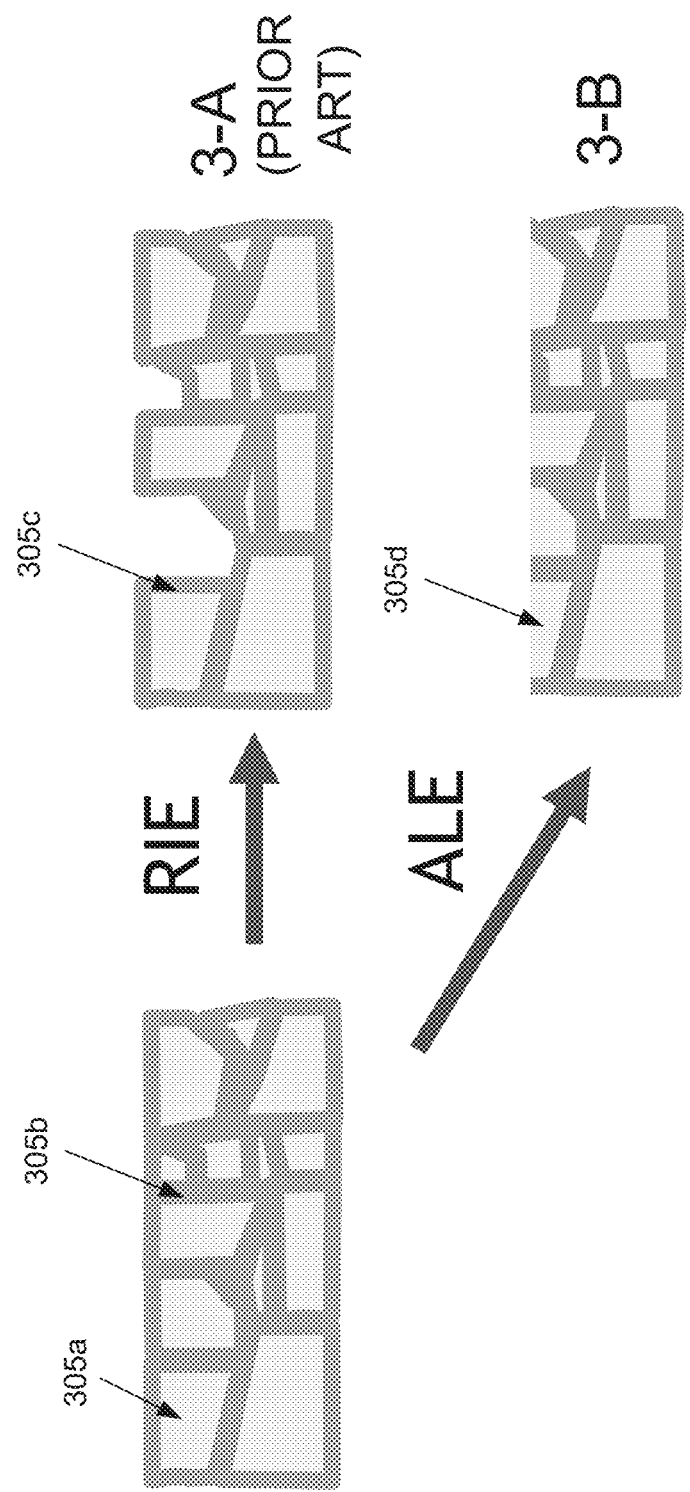
FIG. 3 is a schematic illustration showing grains and grain boundaries before and after reactive ion etching and atomic layer etching.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

During the decade beginning in 2000, the copper damascene process became the dominant integrated circuit fabrication technology used to form metal interconnects. The method for fabricating copper interconnects is the damascene process. The damascene process involves the following generalized operations: (1) depositing a dielectric layer on a substrate, (2) etching the dielectric layer to form trenches or vias, (3) optionally depositing a barrier layer into the trenches or vias, and (4) filling the trenches or vias with metal such as copper. Example barrier layers include tantalum/tantalum nitride (Ta/TaN). In an example damascene process, after the copper vias are formed, a subsequent dielectric layer, such as silicon carbonitride (SiCN), is deposited on the dielectric layer.

Copper damascene interconnect fabrication processing may not be suitable for technology nodes beyond 22 nanometers (e.g., the 15 or 16 nanometer node). As devices shrink, features become smaller, aspect ratios increase, and the trenches and vias in which metal must be deposited become narrower. Deposition of a barrier or liner layer may be used to reduce electromigration, but the thickness of the barrier or liner layer reduces the space remaining in a trench or via for copper to be deposited.

Among some issues are reliability such as damage from electromigration and high via resistance. Reliability issues are related to the increase in current density, partially due to a corresponding decrease in line width. High via resistance is related to the minimum copper diffusion barrier thickness that is used for reliable performance of devices (line leakage, interlayer dielectric (ILD) leakage, electromigration, and stress migration). These concerns led to the industry to shift to alternate metallization schemes. For example, some technologies involve forming tungsten (W) by chemical vapor deposition (CVD) in vias and trenches; however, these technologies limit the grain size to approximately one-half the critical dimension due to the conformal nature of the CVD tungsten deposition. Physical vapor deposition (PVD) may not necessarily be used because PVD is insufficiently conformal and forms voids in the via fill. However, CVD deposited tungsten conformally follows the contours of the via and therefore limits the tungsten grain size. As a result, the metal grains formed in the resulting metal feature are limited in size by the relatively small dimensions of the trench. Since smaller metal grains generally have higher resistivity, metal interconnects formed by a damascene process in these smaller critical dimension trenches have higher resistivity, and thus are less effective than desired.

The technology node of transistors is reaching a point upon which the use of copper interconnects results in challenges that prevent further scaling, which is known as the "RC challenge" whereby R stands for resistivity and C stands for conductivity. For example, in copper interconnect lines, the resistivity of a 10 nm wide line is approximately an order of magnitude higher than that of bulk copper. Resistivity increases due to electron-photon scattering at surfaces and at grain boundaries. In the case of thin wires and/or small grain sizes, the wire resistivity depends on the mean free path of electron scattering besides the bulk resistivity. The additive resistivity due to size shrink is empirically proportional to:

Line resisivity=$\rho\lambda/d$ where $\rho$ is the bulk resistivity, $\lambda$ is the mean free path, d is the relevant length scale decided by wire width or grain size.

Using $\rho\lambda$ as guidance, few materials are identified as potential candidates to replace metals used in the current technology node of logic and memory. Even though their bulk resistivity is a few times higher, they show competitive or supreme conductivity in the sub-10 nm regime. For example, Ru has the potential to replace copper for interconnect lines and/or vias. For memory word line and bit line application, molybdenum indicates advantages to potentially replace tungsten. Other possible materials include osmium, rhodium, iridium, cobalt; or binary/ternary compounds such as CoSi, AlSiC.

One method of forming non-copper metal lines is by performing subtractive etching. Subtractive etching can be used for materials such as aluminum and tungsten by depositing a blanket layer of metal and etching portions of the metal layer to form regions to fill in with dielectric, thereby leaving metal lines or vias defined by an overlying patterned mask. Subtractive etching has been used with etching processes such as reactive ion etching and in some cases, delivery of etching chemistries directly to the blanket layer of metal with the patterned mask over it to etch the metal. Subsequently, the via layer is completed by filling gaps around the metal vias with an insulating material. Subtractive etching may not necessarily involve forming a barrier layer on the metal before depositing the dielectric, depending on the metal used.

While it is possible to perform subtractive etching with other metals, such as refractory metals and high surface binding energy materials such as molybdenum and ruthenium, etching of such materials has been performed using reactive ion etching, which results in uneven etching and rough surfaces due to the difference in etch behavior on grain boundaries versus grains of the metal itself. As feature size continues to shrink, the critical dimension of metals lines reaches the sub-10 nm regime. However, metals have a crystalline grain structure. Reactive ion etching typically has a faster reaction rate at grain boundaries than on the crystalline grains themselves. That is, grain boundaries tend to have weaker bonds, thereby etching faster than grains themselves. This preferential etch at the metal grain boundaries generates line edge roughness that causes variation and increases resistivity of metal contact lines. Thus, metal regions that have certain grain boundaries tend to etch to the shapes of grain boundaries and results in rough surfaces after etching as etching may not be finely controlled. While some reactive ion etch (RIE) can improve line width roughness (LWR) of sidewalls, it is difficult to achieve a line width roughness of less than 2 nm. Moreover, at the etch front in RIE, stochastic behavior can form a selvage layer that tends to roughen the surface on a similar scale to 5 nm. While modulation of stochastic effects, ion-scattering, and micromasking can be used to address these problems, these mechanisms kinetically flattening of the surface, which would be thermodynamically favorable due to lower surface tension.

An example of the prior art is provided in FIGS. 1, 2A, and 2B. In FIG. 1, a substrate includes an underlayer 101, a barrier layer 103, a metal layer 105, and a patterned mask layer 107. In FIG. 2A, the metal layer is etched using reactive ion etching (RIE) using the patterned mask layer 107 as a mask, thereby forming a patterned metal layer 115, which has rough surfaces 150. Such roughness may be present due to etching at grain boundaries having a faster etch rate than on the grains themselves. FIG. 2B is a top view of the patterned metal layer 115 alone, which shows rough surfaces 150 along all etched metal.

Provided herein are methods of performing subtractive etching on refractory metals by atomic layer etching (ALE) techniques to form smooth surfaces on patterned refractory metals.

Not limited to logic, subtractive metal etch has strong downscaling potential for advanced memory applications. Besides interconnects, subtractive metal etch has critical application in memory (DRAM and 3D NAND) for wordline and bit line process. Besides desired line roughness, uniform metal recess without loading among features is also achievable.

In addition to subtractive metal etch, ALE can be applied to DRAM buried wordline recess etch application with smooth surface morphology and good trench to trench recess uniformity. Metallization includes W, Mo, and Ru trench fill, with various options of liners such as titanium nitride (TiN), tungsten carbonitride (WCN), or no liner.

Certain disclosed embodiments allow the formation of ruthenium and/or molybdenum vias without the use of a liner layer.

FIG. 3 shows an example of metal grains 305a and grain boundaries 305b. When reactive ion etching is formed, the surface is rough (see 305c) due to grains being etched as shown in 3-A. In contrast, when atomic layer etching is performed, the substrate in 3-B shows that the surface is smooth (see 305d).

ALE is a multi-step process used in advanced semiconductor manufacturing (e.g. technology node<10 nm) for the blanket removal or pattern-definition etching of ultra-thin layers of material with atomic scale in-depth resolution and control. ALE is a technique that removes thin layers of material using sequential self-limiting reactions. Examples of atomic layer etch techniques are described in U.S. Pat. Nos. 8,883,028 and 8,808,561, which are herein incorporated by reference for purposes of describing example atomic layer etch and etching techniques.

The concept of an "ALE cycle" is relevant to the discussion of various embodiments herein. Generally, an ALE cycle is the minimum set of operations used to perform an etch process one time, such as etching a monolayer. The result of one cycle is that at least some of a film layer on a substrate surface is etched. Typically, an ALE cycle includes a modification operation to form a modified layer, followed by a removal operation to remove or etch only the modified layer. The cycle may include certain ancillary operations such as sweeping, or purging, one of the reactants or byproducts. Generally, a cycle contains one instance of a unique sequence of operations. As an example, an ALE cycle may include the following operations: (i) delivery of a modification gas, (ii) purging of the reactant gas from the chamber, (iii) delivery of a removal gas and an optional plasma, and (iv) purging of the chamber. In some embodiments, etching may be performed nonconformally, including such that the resulting surface may be smoother, including much smoother, than the starting surface.

Figure 4A:
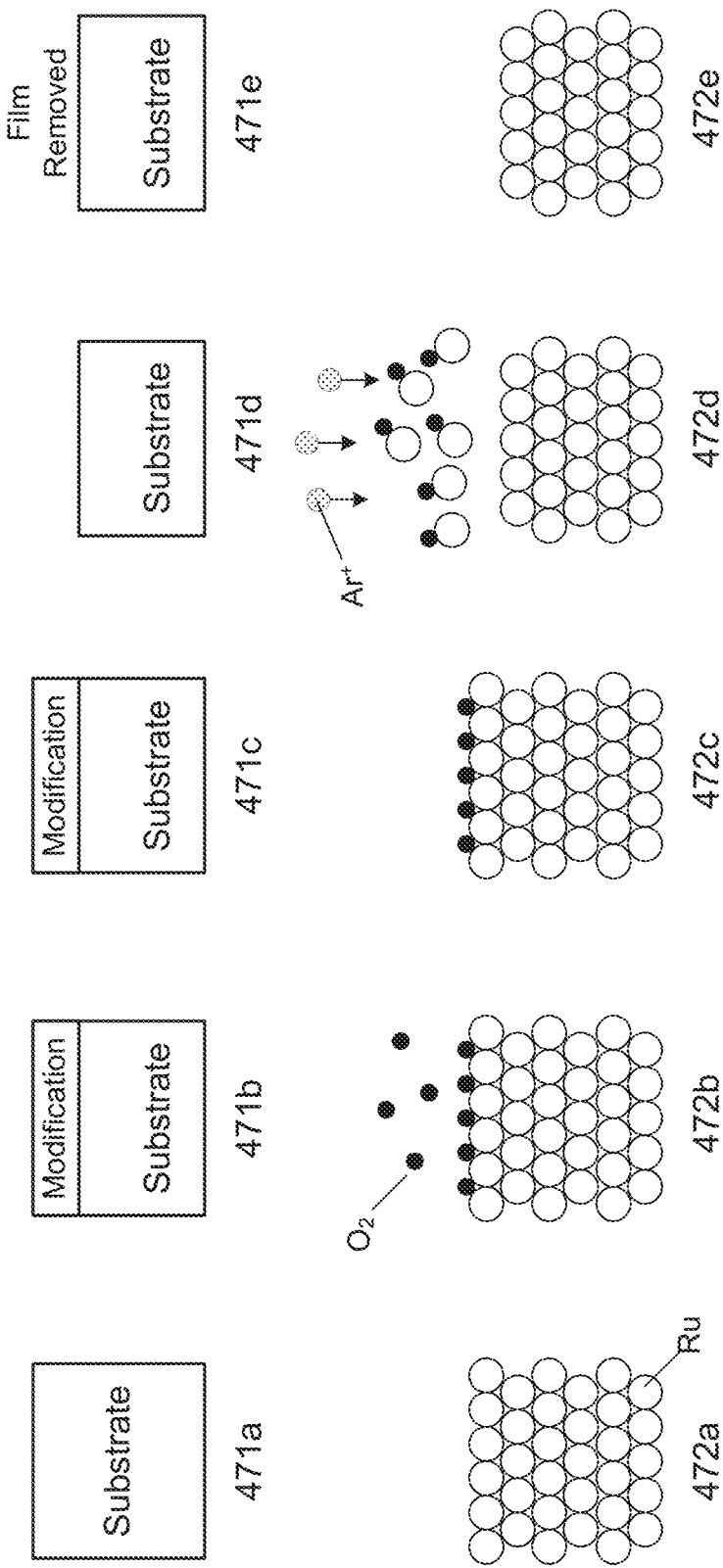
FIG. 4A shows example schematic diagrams of substrates undergoing atomic layer etching.
Figure 4B:
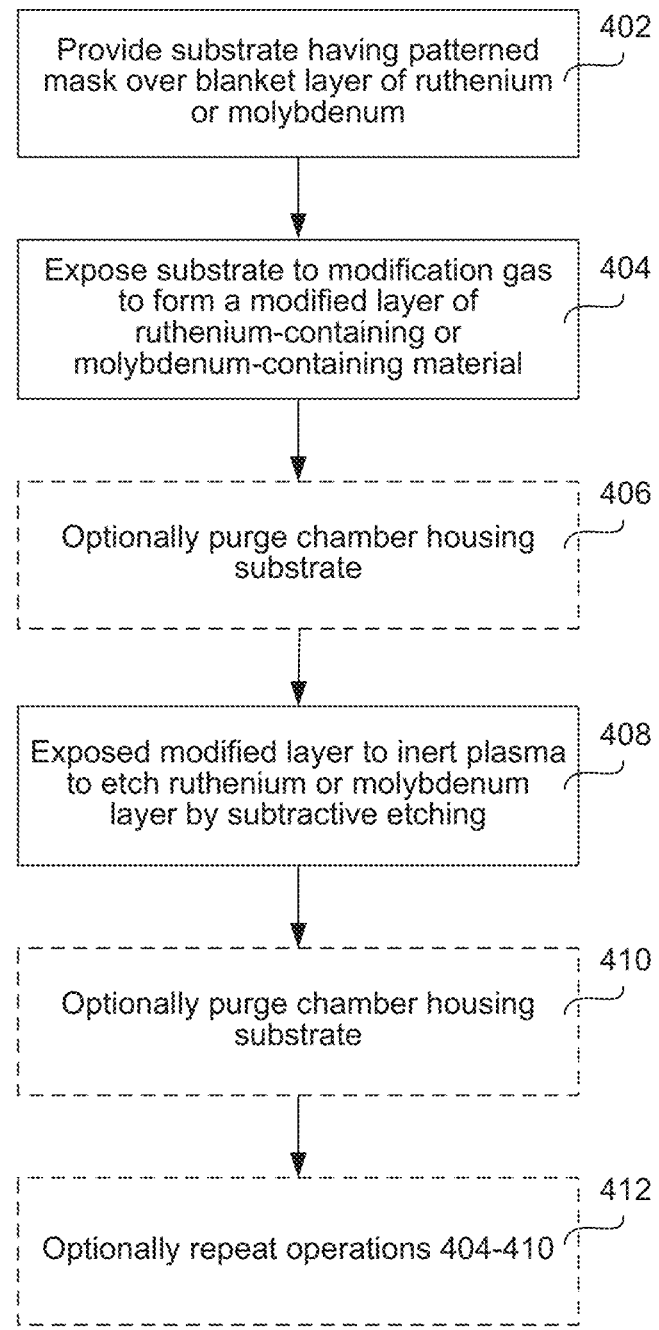
FIG. 4B is a process flow diagram depicting operations for a method in accordance with disclosed embodiments.

FIG. 4A shows two example schematic illustrations of an ALE cycle. Diagrams 471a-471e show a generic ALE cycle. In 471a, the substrate is provided. In 471b, the surface of the substrate is modified forming a modified region of modified metal. Below the modified region is an unmodified metal containing region of unmodified metal. In 471c, the next step is prepared. In 471d, the modified layer of the modified region is being etched. In 471e, the modified layer is removed leaving the unmodified metal containing region of the unmodified metal. Similarly, diagrams 472a-472c show an example of an ALE cycle for etching a ruthenium film. In 472a, a silicon substrate is provided, which includes many ruthenium atoms. In 472b, modification gas oxygen is introduced to the substrate which modifies the surface of the substrate. The schematic in 472b shows that some oxygen is adsorbed onto the surface of the substrate as an example. Although oxygen is depicted in FIG. 4B, any oxygen-containing compound or suitable reactant may be used. In 472c, the modification gas, oxygen, is purged from the chamber. In 472d, a removal gas argon is introduced with a directional plasma as indicated by the Art plasma species and arrows, and ion bombardment is performed to remove the modified surface of the substrate. During this operation, a bias is applied to the substrate to attract ions toward it. In 472e, the chamber is purged and the byproducts are removed.

ALE process conditions, such as chamber pressure, substrate temperature, plasma power, frequency, and type, and bias power, depend on the material to be etched, the composition of the gases used to modify the material to be etched, the material underlying the material to be etched, and the composition of gases used to remove the modified material.

ALE involves splitting the etch process into two (or more) separate operations: modification (operation A) and removal (operation B). For example, the modification operation modifies the surface layer so that it can be removed easily during the removal operation. A thin layer of material is removed per cycle, where a cycle includes modification and removal, and the cycle can be repeated until the desired depth is reached. Synergy means that favorable etching occurs due to interaction of operations A and B. In ALE, operations A and B are separated in either space or time.

Favorable atomic layer etching occurs due to the interaction of operations A and B, and the following "ALE synergy" metric is used to quantify the strength and impact of the synergistic interaction. ALE synergy is calculated by:

$$ALE \text{ Synergy } (\%) = \frac{EPC - (A+B)}{EPC} \times 100\% \qquad \text{(eqn. 1)}$$

where EPC ("etch per cycle") is the thickness of substrate material removed in one ALE cycle, typically averaged over many cycles, and A and B are contributions to the EPC from the stand-alone modification and removal operations, respectfully, measured as reference points by performing these operations independently.

Synergy is a test that captures many aspects of ALE behavior, and is well-suited to compare different ALE conditions or systems. It is an underlying mechanism for why etching in operation B stops after reactants from operation A are consumed. It is therefore responsible for the self-limiting behavior in ALE benefits such as aspect ratio independence, uniformity, smoothness, and selectivity.

ALE is relevant for at least two applications: defining metal lines and/or other features through feature transfer from a mask, and etch back of metals after trench/via deposition.

Certain ALE processes described herein are particularly relevant to ruthenium and molybdenum subtractive etching, but it will be understood that other potential metals may be used.

FIG. 4B provides a process flow diagram for a method that may be performed in accordance with certain disclose embodiments. While FIG. 4B may be described below with respect to etching ruthenium and molybdenum in subtractive patterning applications, it will be understood that other suitable metals may be used in lieu of ruthenium and molybdenum.

In operation 402, a substrate having a patterned mask over a blanket layer of ruthenium or molybdenum is provided to a chamber. The chamber may be a chamber in a multi-chamber apparatus or a single-chamber apparatus. The substrate may be a semiconductor substrate in various embodiments. The substrate may be a silicon wafer, e.g., a 200-mm wafer, a 300-mm wafer, or a 450-mm wafer, including wafers having one or more layers of material, such as dielectric, conducting, or semi-conducting material deposited thereon.

The patterned mask may include patterned mask features. Features may be formed in one or more of the above described layers. One example of a feature is a hole or via in a semiconductor substrate or a layer on the substrate. Features may also be etched to form memory word lines. Another example of a feature is a trench in a substrate or layer. In various embodiments, the features may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In some embodiments, the features may have aspect ratios of at least about 2:1, at least about 4:1, at least about 5:1, at least about 6:1, at least about 10:1, at least about 30:1, or higher. Protection of feature sidewalls may be desirable at high aspect ratios. Disclosed methods may be performed on substrates with features having an opening less than about 150 nm, or less than about 10 nm. A feature via or trench may be referred to as an unfilled feature or a feature. A feature that may have a re-entrant profile that narrows from the bottom, closed end, or interior of the feature to the feature opening. In some embodiments, the methods described herein may be used to form features having these characteristics.

In operation 404, the substrate is exposed to a modification gas to form a layer of ruthenium-containing or molybdenum-containing material. The modification operation forms a thin, reactive surface layer forming a modified metal region with a thickness that is more easily removed than the unmodified metal in the subsequent removal operation.

The etching gas may be selected depending on the type and chemistry of the substrate to be etched. Suitable modification gases can include oxygen ($O_2$), chlorine ($Cl_2$), boron trichloride ($BCl_3$), hydrogen ($H_2$), carbon tetrafluoride ($CF_4$), and combinations thereof. For example, $O_2$ has been shown to be effective for etching and extreme smoothing of ruthenium; $Cl_2$ has been shown to be effective for etching and smoothing of tantalum; and mixtures of $Cl_2$ and $O_2$ have been shown to be effective for etching and smoothing of molybdenum.

During operation 404, the chamber pressure may be between about 50 milliTorr (mTorr) to about 100 mTorr, e.g., about 50 mTorr, about 60 mTorr, about 70 mTorr, about 80 mTorr, about 90 mTorr, or about 100 mTorr. In various embodiments, the modification gas is introduced to the chamber and a plasma is also ignited. In some embodiments, a plasma is not generated. Where a plasma is generated, the power source may be set to a power between about 100 watts (W) and about 1000 W, such as about 100 W, or about 200 W, or about 300 W, or about 400 W, or about 500 W, or about 600 W, or about 700 W, or about 800 W, or about 900 W, or about 1000 W. In various embodiments, where a plasma is ignited a bias is applied. A bias may be applied at any suitable power. During operation 404, a pedestal holding the substrate may set to a suitable temperature to prevent spontaneous etching. The temperature depends on the material to be etched, the layers existing on the substrate, the modification gas, and other process conditions. In some embodiments, the temperature is between about −70 to 150° C., e.g., −70, −60, −50, −40, −30, −20, −10, 0, 10, 20, 30, 40, 50, 60, 70, 80, 90, 100, 110, 120, 130, 140, or 150° C. The duration of operation 404 depends on the topography of the substrate, and the modification chemistry and surface chemistries, as well as the process conditions. In some embodiments, the duration of operation 404 is between about 0.1-5 seconds (s), e.g., 0.1, 0.2, 0.5, 1, 2, 3, 4, or 5 s.

For ruthenium ALE, operation 404 involves exposure to an oxygen-containing gas and optionally generating a plasma. In various embodiments, oxygen plasma ($O_2$ plasma) is used. In various embodiments, oxygen plasma adsorbs to form a modified surface of Ru—O, the process of which is self-limiting. This process converts a metal-metal surface into a modified layer that can have covalent bond formation.

For molybdenum ALE, operation 404 involves exposure to chlorine-containing gas and optionally generating a plasma. In various embodiments, chlorine gas is used. In various embodiments, a mixture of chlorine and oxygen gas is used. Modification forms a Cl— or Cl—/O-adsorbed layer of Mo—Cl or O—Mo—Cl on the surface of the molybdenum and is self-limiting.

In operation 406, the chamber is optionally purged to remove excess modification gas chemistry from the processing space. In a purge operation, non-surface-bound modification gas and/or modification plasma species may be removed from the process chamber. This can be done by purging and/or evacuating the process chamber to remove the modification gas and/or modification plasma species, without removing the adsorbed layer. The species generated in a modification gas plasma can be removed by simply stopping the plasma and allowing the remaining species decay, optionally combined with purging and/or evacuation of the chamber. Purging can be done using any inert gas such as nitrogen ($N_2$), argon (Ar), neon (Ne), helium (He), and their combinations.

In operation 408, the modified layer formed in operation 404 is exposed to a directional inert gas. Removal may be performed by exposing the modified layer to a directional inert gas continuously (continuous ALE), or in pulses (pulsed ALE). Pulsed ALE may allow higher plasma powers and bias powers to be used.

Regardless of whether the directional inert gas is delivered continuously or in pulses, in a removal operation, the substrate is exposed to an energy source (e.g. activating or sputtering gas or chemically reactive species that induces removal), such as argon or helium, to etch the substrate by directional sputtering. In some embodiments, the removal operation may be performed by ion bombardment. During removal, a bias may be optionally turned on to facilitate directional sputtering. In some embodiments, ALE may be isotropic.

The amount of sputtering gas may be controlled such as to etch only a targeted amount of material. In various embodiments, the pressure of the chamber may vary between the modification and removal operations. The pressure of the gas may depend on the size of the chamber, the flow rate of the gas, the temperature of the reactor, the type of substrate, and the size of substrate to be etched.

In various embodiments, operation 408 may be performed at a chamber pressure at about 0.5 mTorr to about 20 mTorr, e.g., 0.5 mTorr, 1 mTorr, 2 mTorr, 5 mTorr, 10 mTorr, 15 mTorr, or 20 mTorr.

The pedestal temperature is set to a particular temperature so as to prevent spontaneous etching and the temperature may, in some embodiments, depend on the material on the substrate. In various embodiments, the temperature is about −70 to 150° C., e.g., −70, −60, −50, −40, 31 30, −20, −10, 0, 10, 20, 30, 40, 50, 60, 70, 80, 90, 100, 110, 120, 130, 140, or 150° C.

The duration of operation 408 may be between about 0.1 seconds and about 10 seconds, e.g., 0.1, 0.2, 0.5, 1, 2, 3, 4, 5, 6, 7, 8, 9 or 10 s, for ion flux about $2 \times 10^{16}/cm^2 * S$ at 50 eV.

In various embodiments, operation 408 includes applying a bias to the pedestal holding the substrate while exposing the substrate to the removal gas. The bias may be applied at a bias power between about 10 (volts) V and about 150 V, e.g., 10, 20, 30, 40, 50, 60, 70, 80, 90, 100, 11, 120, 130, 140, or 150 V bias. In various embodiments, the source power is set to a power between about 100 W and about 1500 W, e.g., 100, 200, 300, 400, 500, 600, 700, 800, 900, or 1000 W.

For ALE of ruthenium, operation 408 involves exposing the modified surface to inert ions (e.g., Ar+) to remove the modified layer, thereby forming volatile RuOx as a byproduct.

In continuous ALE of ruthenium, a bias voltage may be set at about 80V in various embodiments. In various embodiments a continuous bias is applied during exposing the surface of the metal containing layer to an inert bombardment plasma at a bias power between about 60 V and about 100 V in order to cause a plasma formed from the inert gas to provide ion bombardment of the surface of the metal containing layer. In pulsed ALE of ruthenium, the bias is pulsed at a 10% duty cycle between 0 V and a peak bias power between about 600 V to about 1200 V. It will be understood that other duty cycles may be used and that the bias power may be adjusted accordingly depending on the duty cycle used.

For ALE of molybdenum, operation 408 involves exposing the modified surface to inert ions (e.g., Ar+) to remove the modified layer, thereby forming volatile MoCl and/or MoClOx as a byproduct.

In continuous ALE of molybdenum, a bias voltage may be set to about 50 V to about 80 V. In some embodiments of pulsed ALE of molybdenum, the bias is pulsed at a 10% duty cycle between 0 V and a bias power between about 600 V to about 1200 V. The threshold bias of the bias range depends on the properties of the material etched. For examples, some metals used for hard masks could have a higher threshold voltage, and the process window would thereby increase as the bias power range may be higher or wider.

It will be understood that other duty cycles may be used and that the bias power may be adjusted accordingly depending on the duty cycle used.

In operation 410, the chamber is purged to remove byproducts from the chamber. In operation 412, operations 404-410 are optionally repeated in cycles to etch the metal in accordance with a desired subtractive etching application.

Operations 404 and 408, or alternatively 404-410, may constitute one ALE cycle. The concept of an "ALE cycle" is relevant to the discussion of various embodiments herein. Generally, an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal gas and an optional plasma, and (iv) purging of the chamber.

Certain disclosed embodiments have three particular advantages: formation of a smooth etch front on horizontal surfaces, formation of a smooth sidewall and line width roughness on vertical surfaces, and reduction of loading effects.

With respect to formation of smooth etch fronts, for the particular example of subtractively etching ruthenium by ALE, ALE involves forming a self-limiting surface ruthenium layer in $O_2$ plasma which thereby causes the ruthenium surface to be uniformly converted into a modified layer with negligible spontaneous chemical etch. During removal, ion bombardment is used to selectively remove the modified layer. Within one cycle of the absorption and desorption step, the process equalizes the reaction rate on the surface without differentiating grain boundaries from grains. In various embodiments, ALE can produce an even smoother surface than the incoming film that is to be etched. From the self-limiting layer-by-layer ALE process, the surface morphology of starting film is maintained without increasing the roughness. For protuberances on a flat surface, the convex curvature contributes extra surface energy to surface atoms that make them more reactive compared to that of a flat surface. For dents or divots, atoms on the convex curvature are not as reactive due to less surface energy compared with flat regions. During exposure to $O_2$ plasma, the protuberance surface is more reactive potentially forming higher portion of M-O bond with less M-M bond remaining. In the ion bombardment step, inert ions can smooth the surface by amorphization of the very top~1 nm surface. Overall, faster reaction rate on the tip and the diffusion trend from tip to foot of a protuberance smoothens the ALE etch surface, without triggering roughness from grain boundaries.

With respect to formation of a smooth sidewall and line width roughness on vertical surfaces, subtractive etching by ALE can also smooth sidewalls and reduce line width roughness. Unlike tradition reactive ion etch, ruthenium and molybdenum ALE results in the atomic fidelity for pattern transfer toward smooth ruthenium and molybdenum lines. Besides the horizontal smooth etch surface, $O_2$/Ar or $Cl_2$/Ar ALE can yield smooth sidewalls in patterned structures. In some other process, isotropic chemical etching can result in lateral attacks to vertical surfaces. The different etch rates caused by grain and grain boundary defects, or non-uniform sidewall passivation, forms two dimensional roughness along the vertical sidewall. In contrast, a layer-by-layer ALE process does not causing etching vertically or horizontally into sidewalls and can be a highly controlled etching mechanism. The ALE cycles and the directional ion bombardment removes modified layers without a shadowing effect from a mask. Exposure of sidewall surfaces to chemical or physical etch are thereby limited. Such reaction mechanism in ALE thereby improves line edge roughness. While the line width roughness for a reactive ion etched ruthenium or molybdenum metal may be greater than 3 nm, line width roughness of ruthenium or molybdenum metal etched by ALE may be less than about 2 nm. In various embodiments, the surface roughness is reduced by at least 30% compared to the metal surface prior to subtractive etching by atomic layer etching.

Figure 5:
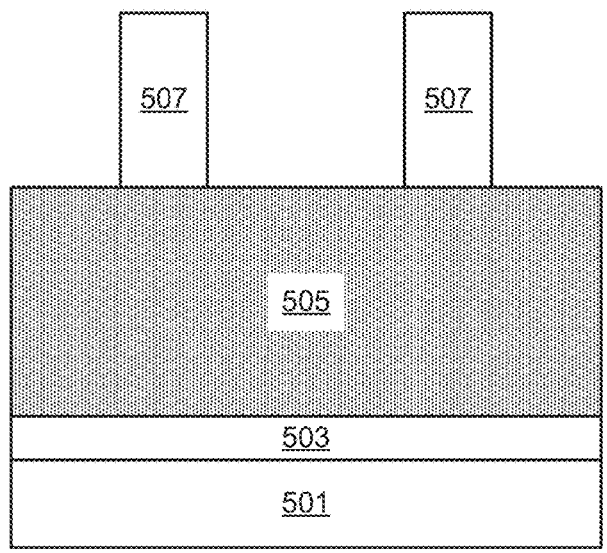
FIGS. 5, 6A, and 6B are schematic illustrations of example substrates undergoing etching processes in accordance with certain disclosed embodiments.
Figure 6A:
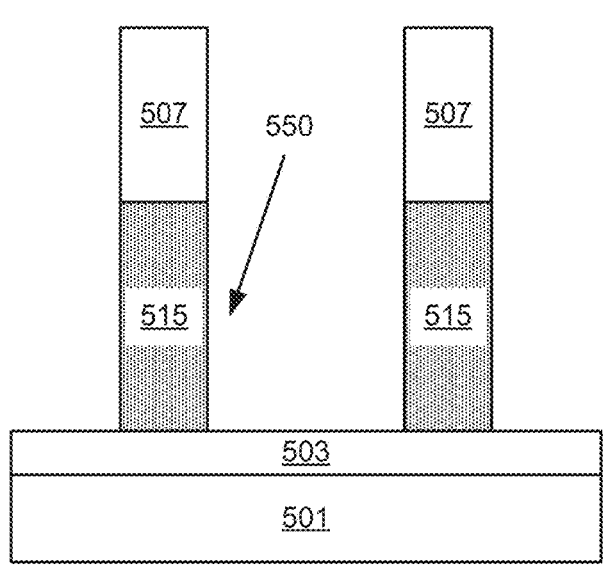
Figure 6B:
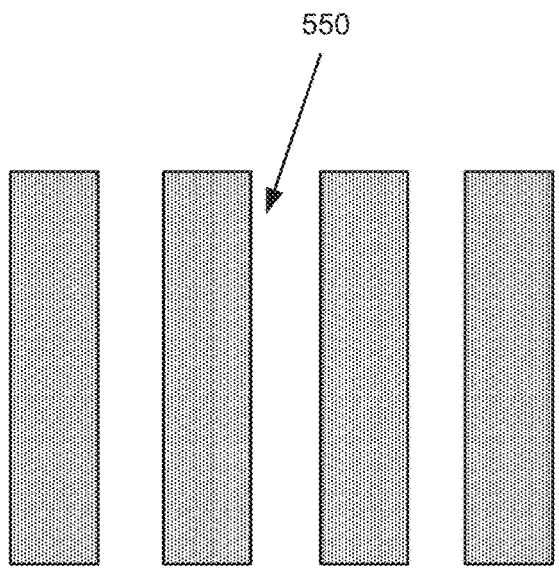

FIGS. 5, 6A, and 6B show example schematic illustrations of substrates during subtractive etching using ALE. In FIG. 5, a substrate includes an underlayer 501, a barrier layer 503, a metal layer 505, and a patterned mask layer 507 defining patterned mask features formed over the metal layer 505. In FIG. 6A, the metal layer is etched using ALE using the patterned mask layer 507 as a mask, thereby forming patterned metal layer 515, which has smooth surfaces 550. FIG. 6B is a top view of the patterned metal layer 515 alone, which shows smooth surfaces 550 along all etched metal. In some embodiments, the metal layer 505 may be a metal containing layer. The patterned mask layer 507 has patterned mask features forming lines. The ALE etches features into the metal layer 505 resulting metal lines with a line width roughness of less than 2 nm.

With respect to reduction of loading effects, ruthenium and molybdenum ALE can also provide aspect ratio independent etch profile for sub-10 nm features as well as iso/wide trenches. Especially for sub-10 nm sizes, one of the most challenging issues for reactive ion etching processes is loading such that etch is aspect ratio dependent. In reactive ion etching, transportation of reactive etch species (neutrals and ions) to the etch front and the movement of etch byproducts out of the features can cause uneven etching in features of different aspect ratios. During reactive ion etching, ion flux and energies interact with the sidewalls when delivered to the etch front of dense trenches and even a small 1 nm variation in trench size could cause a large difference in reduced etch depth of dense trenches. In contrast, an ALE process is self-limiting, which can tolerate variations of trench widths and depths by etching the same amount in each feature regardless of aspect ratio. Since ALE can be modulated such that modification is self-limited, etching is therefore not aspect ratio dependent which expands process windows for sub-10 nm structures.

Figure 7:
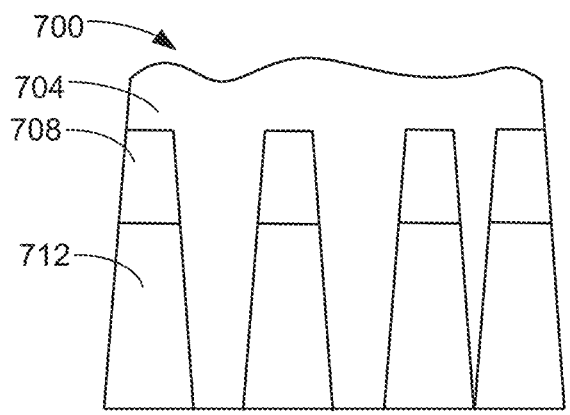
FIG. 7 is a schematic illustration of an example substrate having metal deposited thereon.
Figure 8:
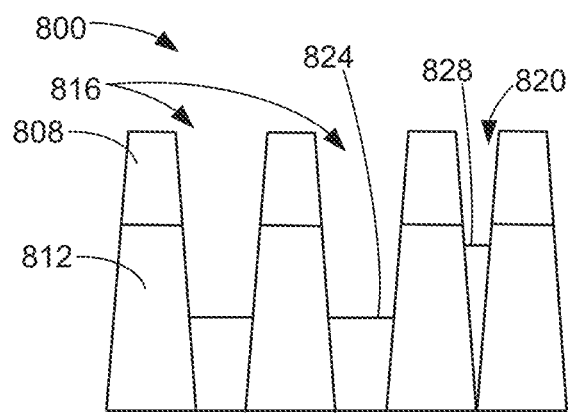
FIG. 8 is a schematic illustration of an example substrate after etching by reactive ion etching using a prior art process.

FIG. 7 illustrates a cross-sectional view of part of a stack 700, where a metal containing layer 704 is over a patterned mask 708 over a patterned dielectric layer 712. FIG. 8 illustrates a cross-sectional view of part of a stack 800 etched according to the prior art. The stack 800 comprises a patterned mask 808 over a patterned dielectric layer 812. The patterned mask 808 and patterned dielectric layer 812 form wider features 816 and a narrower feature 820. Using prior art etch methods, the metal containing layer in the wider features 816 etch faster than parts of the metal containing layer in the narrower feature 820. As a result, parts of the metal containing layer 824 in the wider features 816 are etch further than the part of the metal containing layer 828 in the narrower feature 820. As a result, there is a nonuniformity in the etch back of the line between the metal containing layer 824 in the wider features compared to the metal containing layer 828 in the narrower feature 820. In some embodiments, the nonuniformity of the line is greater than 5 nm.

Figure 9:
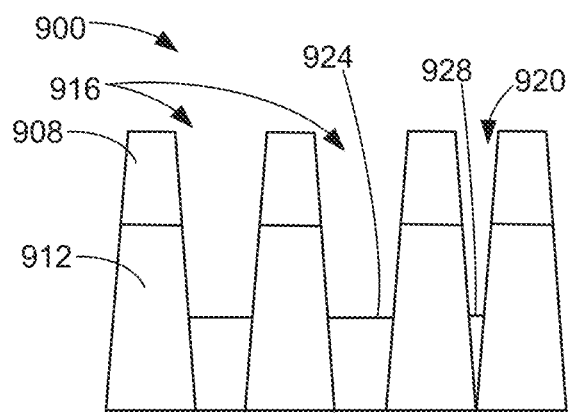
FIG. 9 is a schematic illustration of an example substrate after etching by atomic layer etching.

FIG. 9 illustrates a cross-sectional view of part of a stack 900 etched according to an embodiment using an atomic layer etch of the metal containing layer. The stack 900 comprises a patterned mask 908 over a patterned dielectric layer 912. The patterned mask 908 and patterned dielectric layer 912 form wider features 916 and a narrower feature 920. The metal containing layer is formed over the patterned mask 908, so that the metal containing layer fills the wider features 916 and narrower feature 920 of the patterned mask 908. In an embodiment that provides an atomic layer etch, the metal containing layer in the wider features 916 etch at the same rate as parts of the metal containing layer in the narrower feature 920. As a result, parts of the metal containing layer 924 in the wider features 916 are etch about equally to the part of the metal containing layer 928 in the narrower feature 920. In various embodiments, the nonuniformity of the line caused by any disparity in the rate of etching the metal containing layer 924 in the wider features 916 compared to the metal containing layer 928 in the narrower feature 920 is less than 5 nm.

The terms "semiconductor wafer," "wafer," "substrate," "wafer substrate," and "partially fabricated integrated circuit" are used interchangeably. "Partially fabricated integrated circuit" can refer to a silicon or other semiconductor wafer during any of many stages of integrated circuit fabrication thereon. A substrate used in the semiconductor device industry typically has a diameter of 200 millimeters (mm) or 300 mm, though the industry is moving towards the adoption of 450 mm diameter substrates. The flow rates and conditions provided herein are appropriate for processing on 300 mm substrates. One of ordinary skill in the art would appreciate that these flows may be adjusted as necessary for substrates of other sizes. Power levels and flow rates generally scale linearly with the number of stations and substrate area. The flow rates and powers may be represented on a per area basis. In addition to reaction chambers used to deposit films on semiconductor substrates, other types of deposition reactors may take advantage of the disclosed embodiments. Other types of reactors that may benefit from the disclosed embodiments include those used to fabricate various articles such as printed circuit boards, displays, and the like.

APPARATUS

Figure 10:
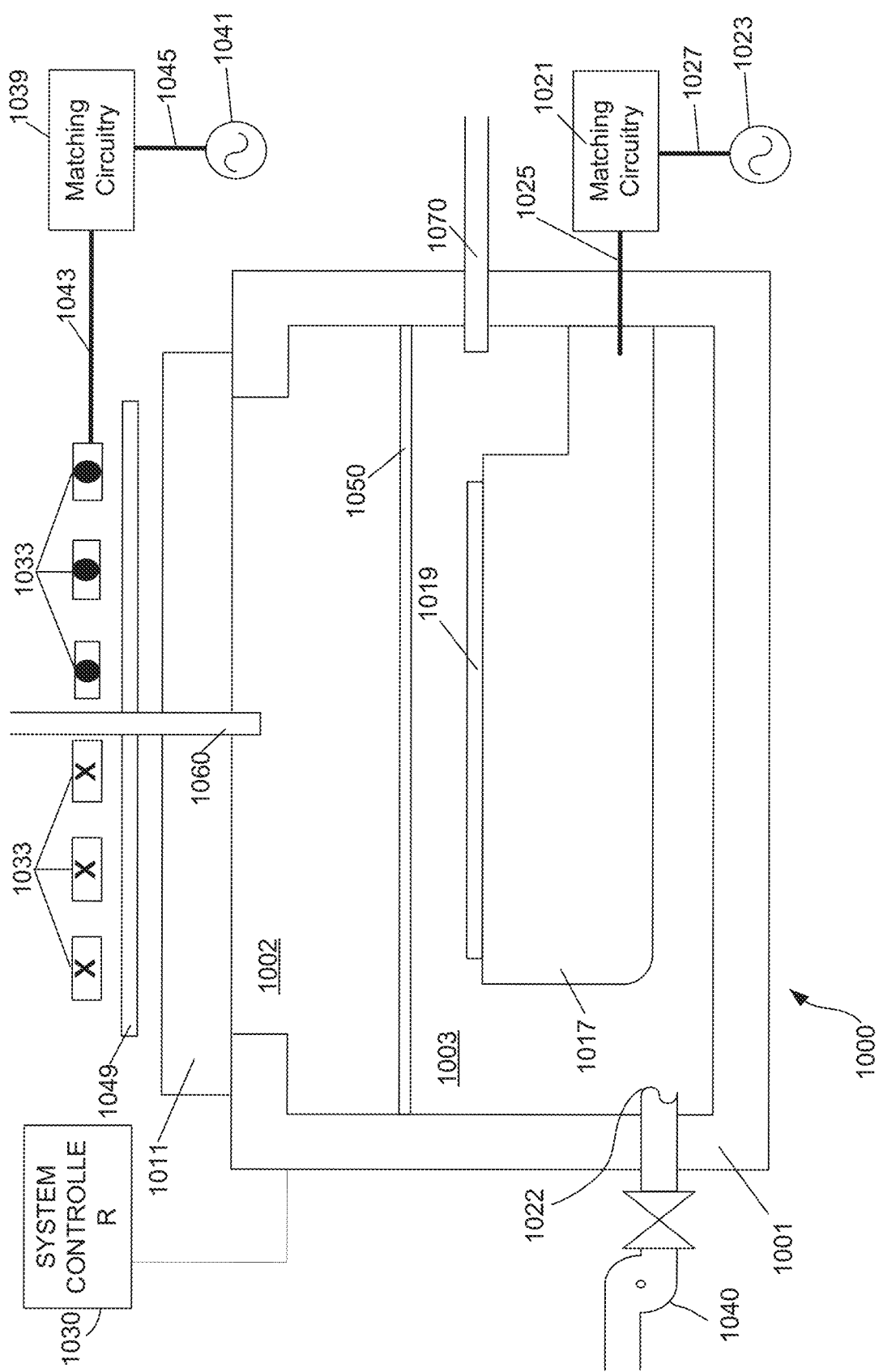
FIG. 10 is a schematic diagram of an example process chamber for performing certain disclosed embodiments.

FIG. 10 schematically shows a cross-sectional view of an inductively coupled plasma etching apparatus 1000 in accordance with certain embodiments herein. A Kiyo TM reactor, produced by Lam Research Corp. of Fremont, CA, is an example of a suitable reactor that may be used to implement the techniques described herein. The inductively coupled plasma etching apparatus 1000 includes an overall etching chamber 1001 structurally defined by chamber walls and a window 1011. The chamber walls may be fabricated from stainless steel or aluminum. The window 1011 may be fabricated from quartz or other dielectric material. An optional internal plasma grid 1050 divides the overall etching chamber into an upper sub-chamber 1002 and a lower sub-chamber 1003. The plasma grid 1050 may include a single grid or multiple individual grids. In many embodiments, plasma grid 1050 may be removed, thereby utilizing a chamber space made of upper sub-chamber 1002 and lower sub-chamber 1003.

A chuck 1017 is positioned within the lower sub-chamber 1003 near the bottom inner surface. The chuck 1017 is configured to receive and hold a semiconductor wafer 1019 upon which the etching process is performed. The chuck 1017 can be an electrostatic chuck for supporting the semiconductor wafer 1019 when present. In some embodiments, an edge ring (not shown) surrounds chuck 1017, and has an upper surface that is approximately planar with a top surface of a semiconductor wafer 1019, when present over chuck 1017. The chuck 1017 also includes electrostatic electrodes for chucking and dechucking the semiconductor wafer. A filter and DC clamp power supply (not shown) may be provided for this purpose. Other control systems for lifting the semiconductor wafer 1019 off the chuck 1017 can also be provided. The chuck 1017 can be electrically charged using an RF power supply 1023. The RF power supply 1023 is connected to matching circuitry 1021 through a connection 1027. The matching circuitry 1021 is connected to the chuck 1017 through a connection 1025. In this manner, the RF power supply 1023 is connected to the chuck 1017. The chuck may be biased to any suitable bias power, such as between about 10 V and about 150 V, e.g., 10, 20, 30, 40, 50, 60, 70, 80, 90, 100, 11, 120, 130, 140, or 150 V bias. In some cases, the bias may be pulsed between 0 V and a bias peak power between about 600 V and about 1200 V at a duty cycle of about 10%.

A coil 1033 is positioned above window 1011. The coil 1033 is fabricated from an electrically conductive material and includes at least one complete turn. The exemplary coil 1033 shown in FIG. 10 includes three turns. The cross-sections of coil 1033 are shown with symbols, and coils having an "X" extend rotationally into the page, while coils having a "•" extend rotationally out of the page. An RF power supply 1041 is configured to supply RF power to the coil 1033. In general, the RF power supply 1041 is connected to matching circuitry 1039 through a connection 1045. The matching circuitry 1039 is connected to the coil 1033 through a connection 1043. In this manner, the RF power supply 1041 is connected to the coil 1033. An optional Faraday shield 1049 is positioned between the coil 1033 and the window 1011. The Faraday shield 1049 is maintained in a spaced apart relationship relative to the coil 1033. The Faraday shield 1049 is disposed immediately above the window 1011. The coil 1033, the Faraday shield 1049, and the window 1011 are each configured to be substantially parallel to one another. The Faraday shield may prevent metal or other species from depositing on the dielectric window of the plasma chamber.

Process gases (such as oxygen ($O_2$), chlorine ($Cl_2$), boron trichloride ($BCl_3$), hydrogen ($H_2$), carbon tetrafluoride ($CF_4$), and combinations thereof) may be supplied through a main injection port 1060 positioned in the upper chamber and/or through a side injection port 1070, sometimes referred to as an STG. A vacuum pump, e.g., a one or two stage mechanical dry pump and/or turbomolecular pump 1040, may be used to draw process gases out of the process chamber and to maintain a pressure within the process apparatus 1000 by using a closed-loop-controlled flow restriction device, such as a throttle valve (not shown) or a pendulum valve (not shown), during operational plasma processing.

During operation of the apparatus, one or more reactant gases may be supplied through injection ports 1060 and/or 1070. In certain embodiments, gas may be supplied only through the main injection port 1060, or only through the side injection port 1070. In some cases, the injection ports may be replaced by showerheads. The Faraday shield 1049 and/or optional plasma grid 1050 may include internal channels and holes that allow delivery of process gases to the chamber. Either or both of Faraday shield 1049 and optional plasma grid 1050 may serve as a showerhead for delivery of process gases.

Radio frequency power is supplied from the RF power supply 1041 to the coil 1033 to cause an RF current to flow through the coil 1033. The RF current flowing through the coil 1033 generates an electromagnetic field about the coil 1033. The electromagnetic field generates an inductive current within the upper sub-chamber 1002. The physical and chemical interactions of various generated ions and radicals with the semiconductor wafer 1019 selectively etch features of the wafer.

If the plasma grid 1050 is used such that there is both an upper sub-chamber 1002 and a lower sub-chamber 1003, the inductive current acts on the gas present in the upper sub-chamber 1002 to generate an electron-ion plasma in the upper sub-chamber 1002. The optional internal plasma grid 1050, if present, may act to limit the number of hot electrons in the lower sub-chamber 1003. In some embodiments, the apparatus is designed and operated such that the plasma present in the lower sub-chamber 1003 is an ion-ion plasma. In other embodiments, the apparatus may be designed and operated such that the plasma present in the lower sub-chamber 1003 is an electron-ion plasma.

Volatile etching byproducts may be removed from the lower-sub chamber 1003 through port 1022. The chuck 1017 disclosed herein may operate at elevated temperatures ranging between about 30° C. and about 250° C. In some cases, the chuck 1017 may also operate at lower temperatures, for example when the chuck 1017 is actively chilled. In such cases, the chuck 1017 may operate at substantially lower temperatures, as desired. The temperature will depend on the etching process operation and specific recipe. In some embodiments, the chamber 1001 may operate at pressures in the range of between about 1 mTorr and about 100 mTorr or between about 50 mTorr to about 100 mTorr, e.g., about 50 mTorr, about 60 mTorr, about 70 mTorr, about 80 mTorr, about 90 mTorr, or about 100 mTorr. In certain embodiments, the pressure may be higher.

Chamber 1001 may be coupled to facilities (not shown) when installed in a clean room or a fabrication facility. Facilities include plumbing that provide processing gases, vacuum, temperature control, and environmental particle control. These facilities are coupled to chamber 1001, when installed in the target fabrication facility. Additionally, chamber 1001 may be coupled to a transfer chamber that allows robotics to transfer semiconductor wafers into and out of chamber 1001 using typical automation.

In some embodiments, a system controller 1030 (which may include one or more physical or logical controllers) controls some or all of the operations of an etching chamber. The system controller 1030 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the system controller 1030 or they may be provided over a network. In certain embodiments, the system controller 1030 executes system control software.

In some cases, the system controller 1030 controls gas concentration, wafer movement, and/or the power supplied to the coils 1033 and/or electrostatic chuck 1017. The system controller 1030 may control the gas concentration by, for example, opening and closing relevant valves to produce one or more inlet gas stream that provide the necessary reactant(s) at the proper concentration(s). The wafer movement may be controlled by, for example, directing a wafer positioning system to move as desired. The power supplied to the coils 1033 and/or chuck 1017 may be controlled to provide particular RF power levels. Similarly, if the internal plasma grid 1050 is used, any RF power applied to the grid may be adjusted by the system controller 1030.

The system controller 1030 may control these and other aspects based on sensor output (e.g., when power, potential, pressure, etc. reach a certain threshold), the timing of an operation (e.g., opening valves at certain times in a process), or based on received instructions from the user. An example controller is further discussed below.

Figure 11:
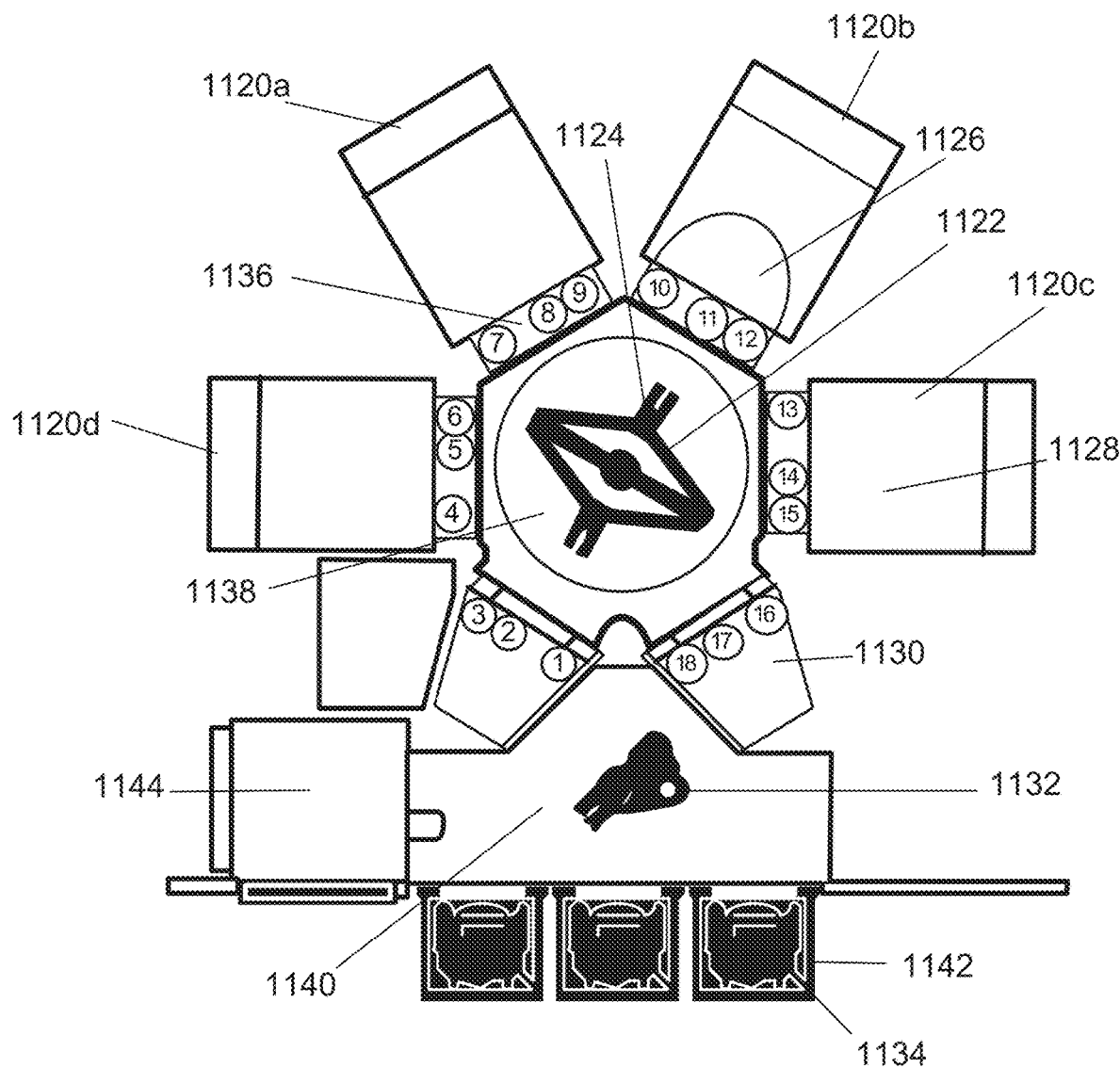
FIG. 11 is a schematic diagram of an example process apparatus for performing certain disclosed embodiments.

FIG. 11 depicts a semiconductor process cluster architecture with various modules that interface with a vacuum transfer module 1138 (VTM). The arrangement of transfer modules to "transfer" wafers among multiple storage facilities and processing modules may be referred to as a "cluster tool architecture" system. Airlock 1130, also known as a loadlock or transfer module, is shown in VTM 1138 with four processing modules 1120*a*-1120*d*, which may be individually optimized to perform various fabrication processes. By way of example, processing modules 1120*a*-1120*d* may be implemented to perform substrate etching, deposition, ion implantation, wafer cleaning, sputtering, and/or other semiconductor processes. One or more of the substrate etching processing modules (any of 1120*a*-1120*d*) may be implemented as disclosed herein. Airlock 1130 and process module 1120 may be referred to as "stations." Each station has a facet 1136 that interfaces the station to VTM 1138. Inside each facet, sensors 1-18 are used to detect the passing of wafer 1126 when moved between respective stations.

Robot 1122 transfers wafer 1126 between stations. In one embodiment, robot 1122 has one arm, and in another embodiment, robot 1122 has two arms, where each arm has an end effector 1124 to pick wafers such as wafer 1126 for transport. Front-end robot 1132, in atmospheric transfer module (ATM) 1140, is used to transfer wafers 1126 from cassette or Front Opening Unified Pod (FOUP) 1134 in Load Port Module (LPM) 1142 to airlock 1130. Module center 1128 inside process module 1120 is one location for placing wafer 1126. Aligner 1144 in ATM 1140 is used to align wafers.

In an exemplary processing method, a wafer is placed in one of the FOUPs 1134 in the LPM 1142. Front-end robot 1132 transfers the wafer from the FOUP 1134 to an aligner 1144, which allows the wafer 1126 to be properly centered before it is etched or processed. After being aligned, the wafer 1126 is moved by the front-end robot 1132 into an airlock 1130. Because airlock modules have the ability to match the environment between an ATM and a VTM, the wafer 1126 is able to move between the two pressure environments without being damaged. From the airlock 1130, the wafer 1126 is moved by robot 1122 through VTM 1138 and into one of the process modules 1120*a*-1120*d*. In order to achieve this wafer movement, the robot 1122 uses end effectors 1124 on each of its arms. Once the wafer 1126 has been processed, it is moved by robot 1122 from the process modules 1120*a*-1120*d* to an airlock 1130. From here, the wafer 1126 may be moved by the front-end robot 1132 to one of the FOUPs 1134 or to the aligner 1144.

It should be noted that the computer controlling the wafer movement can be local to the cluster architecture, or can be located external to the cluster architecture in the manufacturing floor, or in a remote location and connected to the cluster architecture via a network.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Figure 12:
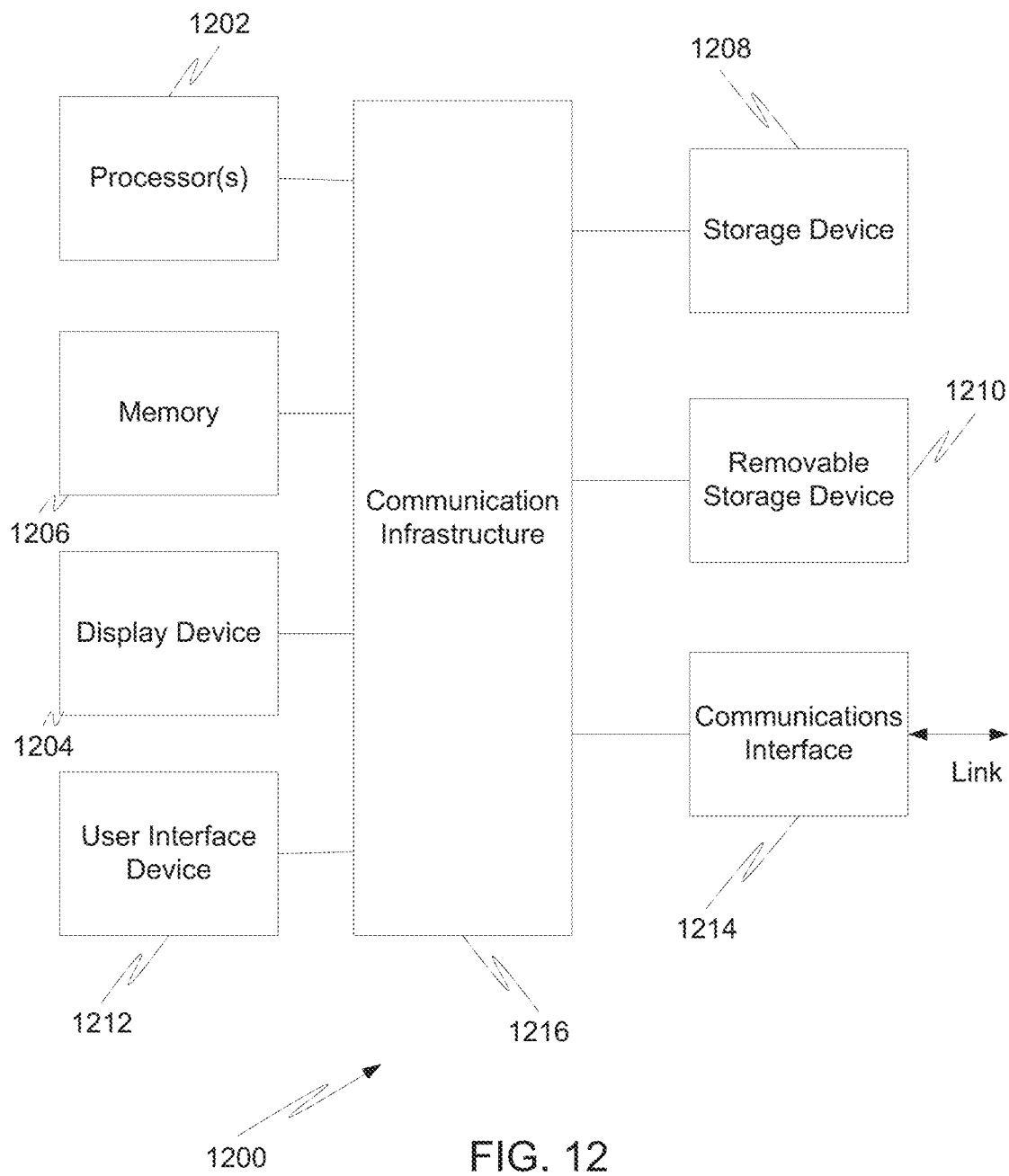
FIG. 12 is a schematic view of a computer system that may be used in practicing an embodiment.

FIG. 12 is a high level block diagram showing a computer system 1200 that is suitable for implementing a controller used in embodiments. The computer system may have many physical forms ranging from an integrated circuit, a printed circuit board, and a small handheld device, up to a huge supercomputer. The computer system 1200 includes one or more processors 1202, and further can include an electronic display device 1204 (for displaying graphics, text, and other data), a main memory 1206 (e.g., random access memory (RAM)), storage device 1208 (e.g., hard disk drive), removable storage device 1210 (e.g., optical disk drive), user interface devices 1212 (e.g., keyboards, touch screens, keypads, mice or other pointing devices, etc.), and a communication interface 1214 (e.g., wireless network interface). The communication interface 1214 allows software and data to be transferred between the computer system 1200 and external devices via a link. The system may also include a communications infrastructure 1216 (e.g., a communications bus, cross-over bar, or network) connected to the aforementioned devices/modules.

Information transferred via communications interface 1214 may be in the form of signals such as electronic, electromagnetic, optical, or other signals capable of being received by communications interface 1214, via a communication link that carries signals and may be implemented using wire or cable, fiber optics, a phone line, a cellular phone link, a radio frequency link, and/or other communication channels. With such a communications interface, it is contemplated that the one or more processors 1202 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory, and shall not be construed to cover transitory subject matter, such as carrier waves or signals. Examples of computer code include machine code, such as one produced by a compiler, and files containing higher level code that are executed by a computer using an interpreter. Computer readable media may also be computer code transmitted by a computer data signal embodied in a carrier wave and representing a sequence of instructions that are executable by a processor.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers. Various embodiments may use chambers that are inductively coupled, capacitively coupled, a combination of both or may use other power systems.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Some embodiments do not provide the inert gas for forming the inert plasma during the exposure to the modification gas (step 402) that modifies at least a region of a surface of the metal containing layer to form a modified metal containing region. Such embodiments provide the modification gas during the exposure to the modification gas (step 404), but might not provide the modification gas during the exposing the modified layer to the inert bombardment plasma (step 408) generated from an inert gas to selectively remove the modified metal containing region. In various embodiments, the metal containing layer comprises at least one of metal containing layer comprises at least one of ruthenium, tungsten, titanium, or molybdenum. In various embodiments, the modified metal containing region may comprise at least one of ruthenium oxide, tungsten chloride, molybdenum chloride, or molybdenum oxide.

In other embodiments, the inert gas for forming the inert plasma is continuously provided during the exposure to the modification gas (step 402) that modifies at least a region of a surface of the metal containing layer to form a modified metal containing region and during the exposing the modified layer to the inert bombardment plasma (step 408) generated from an inert gas to selectively remove the modified metal containing region. Some embodiments only provide the modification gas during the exposure to the modification gas (step 402). In such embodiments, a bias is provided that is sufficient to provide the inert bombardment plasma only during the exposure to the modified layer to the inert plasma (step 408) and where the exposure to the modification gas (step 404) does not have a bias sufficient to provide an inert bombardment plasma.

In other embodiments, the inert gas for forming the inert plasma and the modification gas are continuously provided during the exposure to the modification gas (step 402) that modifies at least a region of a surface of the metal containing layer to form a modified metal containing region and during the exposing the modified layer to the inert plasma (step 408). In such embodiments, a bias is provided that is sufficient to provide the inert bombardment plasma only during the exposure to the modified layer to the inert plasma (step 408) and wherein the exposure to the modification gas (step 404) does not have a bias sufficient to provide an inert bombardment plasma. In addition, sufficient plasma excitation power is provided that is sufficient to form a plasma from the modification gas only during the exposure to the modification gas (step 404) and wherein the exposure to modified layer to the inert plasma (step 408) the does not have sufficient plasma excitation power to form a plasma from the modification gas. In such an embodiment, the pulsing of the bias power and the plasma energy provide the different steps for each ALE cycle, even if the gas flow of the modification gas and the inert gas is constant.

A. EXPERIMENTAL b. Experiment 1

Figure 13A:
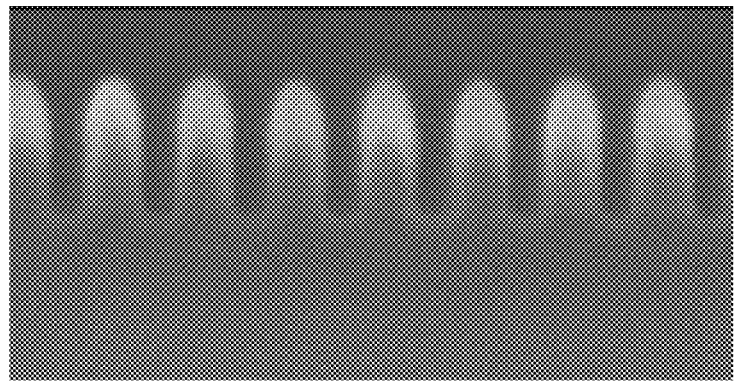
FIG. 13A is a cross-section view of an image of ruthenium subtractively etched using atomic layer etching.
Figure 13B:
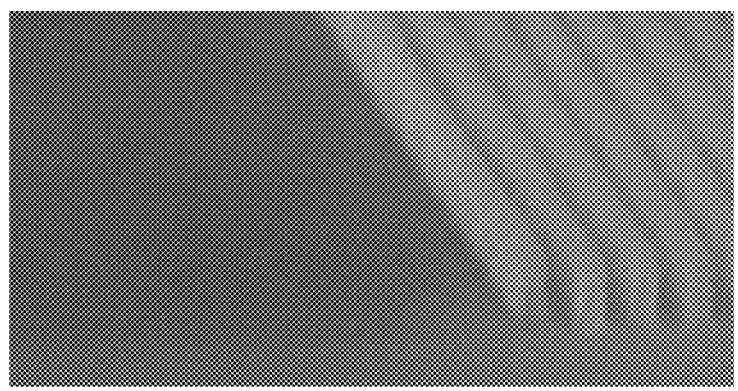
FIG. 13B is a bird's-eye view of an image of ruthenium subtractively etched using atomic layer etching.
Figure 13C:
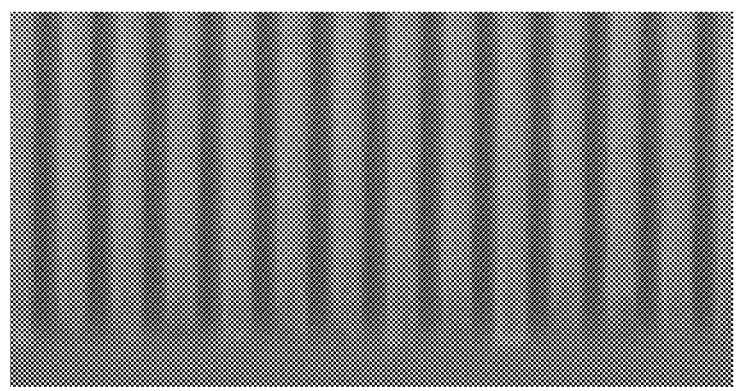
FIG. 13C is a top view of an image of ruthenium subtractively etched using atomic layer etching.

A substrate having a blanket layer of ruthenium and a patterned mask having a critical dimension of 16 nm±1 nm over the ruthenium was provided. The substrate was exposed to cycles of pulsed atomic layer etching—that is, cycles of exposure to oxygen plasma and exposure to pulsed-bias argon plasma were repeated to etch the ruthenium. The bias pulsing was performed using a 10% duty cycle at about 900 V. The resulting substrate after subtractively etching ruthenium using pulsed ALE is depicted in FIG. 13A in a side cross-sectional view, FIG. 13B from a top angled bird's-eye view, and in FIG. 13C from a top view. The results indicate smooth sidewalls and clearly defined patterned ruthenium remaining on the substrate.

c. Experiment 2

Figure 13D:
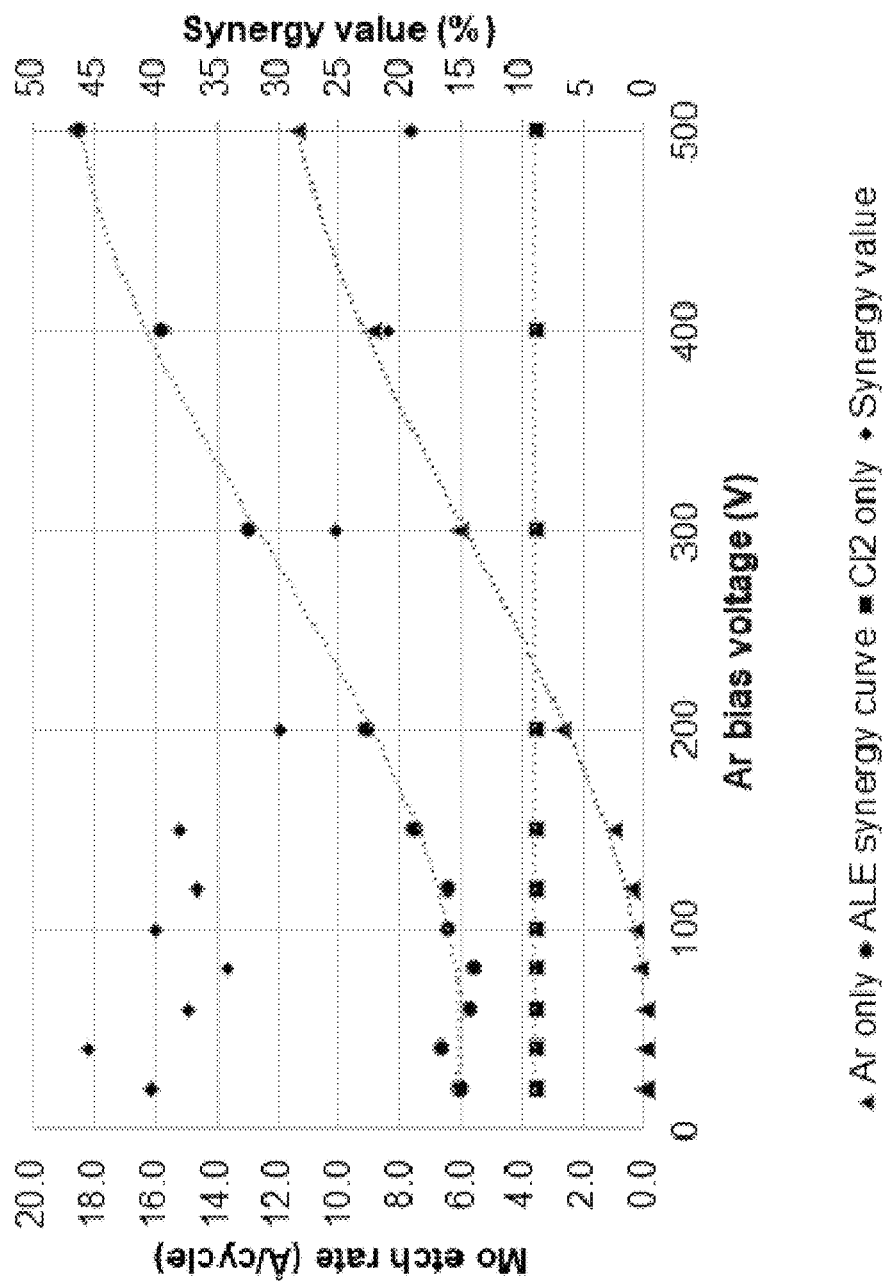
FIG. 13D shows a graph of molybdenum etch rate as a function of argon bias voltage and ALE synergy for molybdenum.

ALE synergy was calculated for various bias voltages used for performing ALE of molybdenum, and molybdenum etch rates were also measured. FIG. 13D shows a graph of molybdenum etch rate as a function of argon bias voltage for argon-only exposure and chlorine-only exposure, as well as the ALE synergy curve and the synergy value calculated.

d. Experiment 3

Figure 14A:
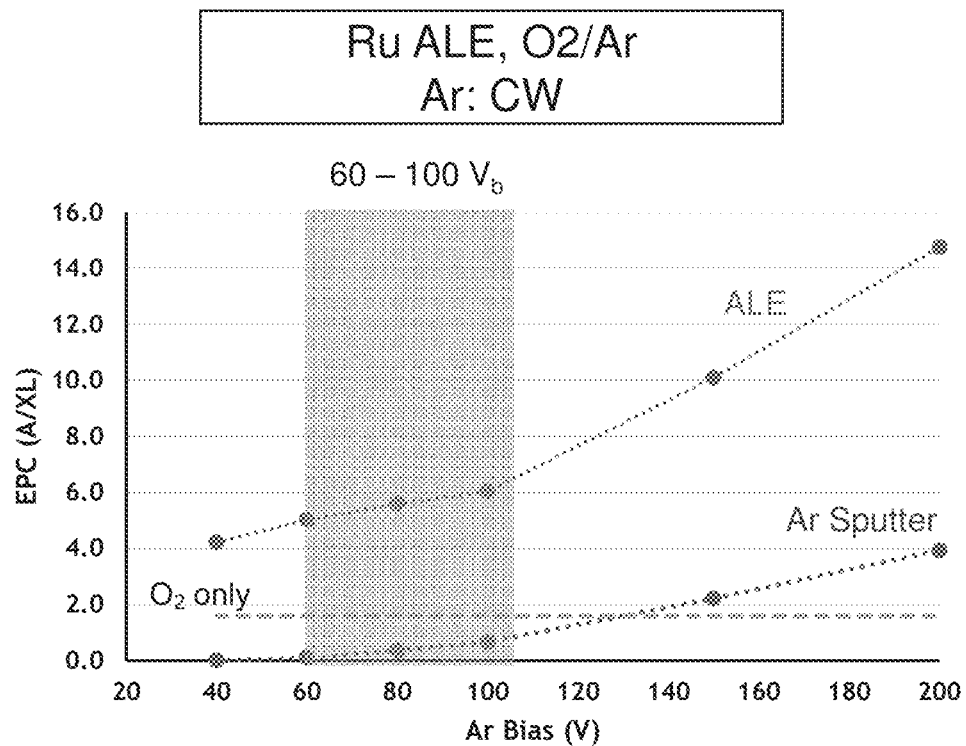
FIG. 14A shows a graph of ruthenium etch rate as a function of argon bias voltage in continuous atomic layer etching.

Ruthenium was etched using $O_2$/Ar ALE with continuous Ar bias, and an "ALE window" for various bias voltages used during removal was obtained. FIG. 14A shows a graph depicting the etch per cycle of argon sputtering only (labeled Ar sputter), and oxygen exposure only (labeled $O_2$ only), and ALE using alternating exposures of oxygen and inert argon plasma (labeled ALE). The optimal window achieved is between 60V and 100V.

Figure 14B:
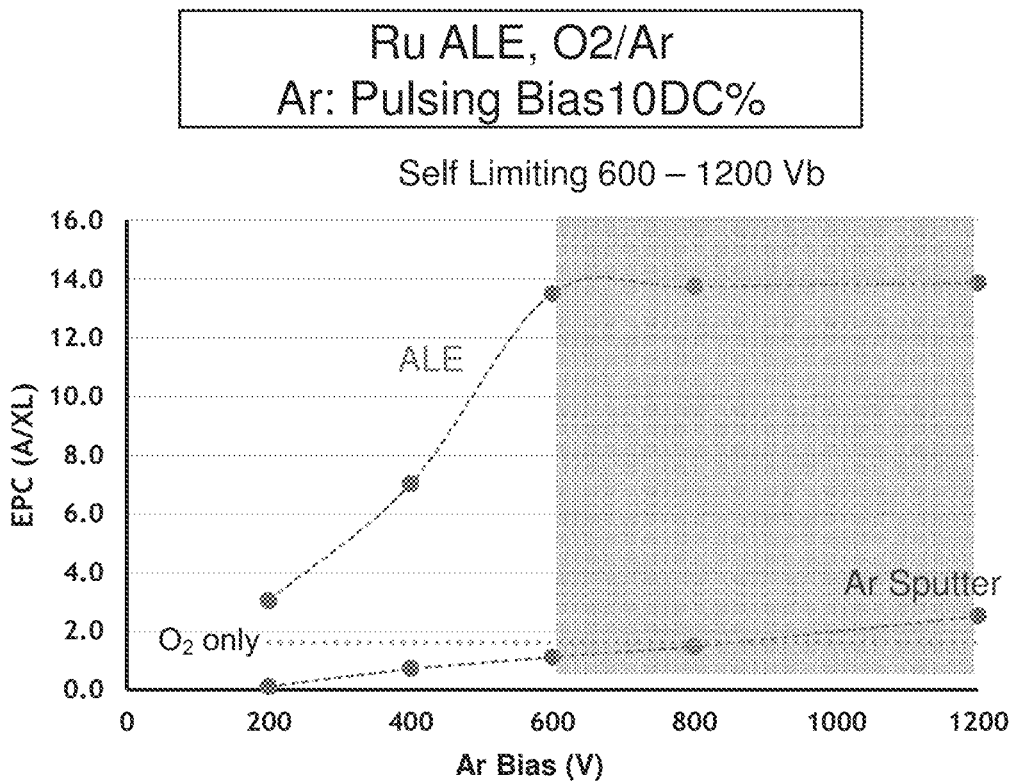
FIG. 14B shows a graph of ruthenium etch rate as a function of argon bias voltage in pulsed atomic layer etching.

Ruthenium was etched using pulsed ALE (with pulsing Ar bias) and an "ALE window" for various bias voltages used during removal was obtained. FIG. 14B shows a graph depicting the etch per cycle of argon sputtering only (labeled Ar sputter), oxygen exposure only (labeled $O_2$ only), and ALE using alternating exposures of oxygen and pulsed inert argon plasma using a duty cycle of 10% (labeled ALE). The optimal window achieved is between 600 V and 1200 V.

Figure 14C:
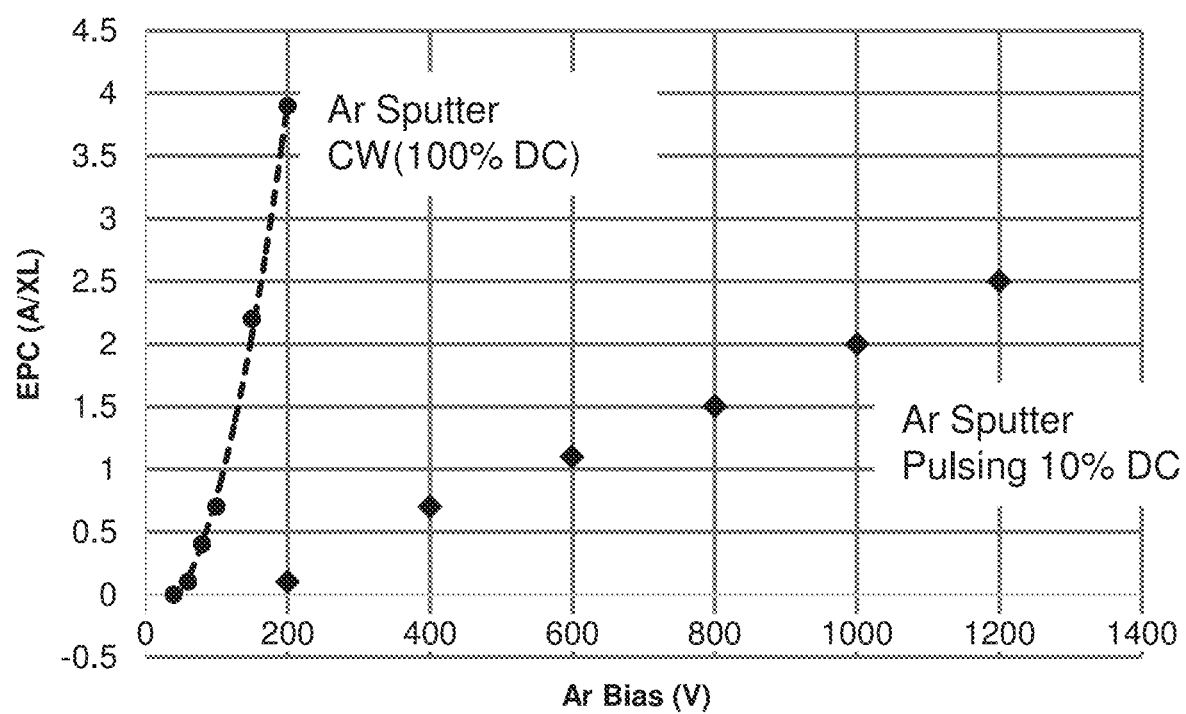
FIG. 14C shows a graph of ruthenium etch rate as a function of argon bias when exposed only to argon sputtering in continuous and pulsed sputtering.

Ruthenium was exposed to argon sputtering only to show the intrinsic effect of removal of ruthenium by sputtering only without modification for both continuous exposure (100% duty cycle) and pulsed exposure (10%) duty cycle. The results are shown in FIG. 14C, which shows the broader range of argon bias powers that may be used without as high of an etch rate when using pulsed ALE as compared to continuous ALE.

e. Experiment 4

Figure 15A:
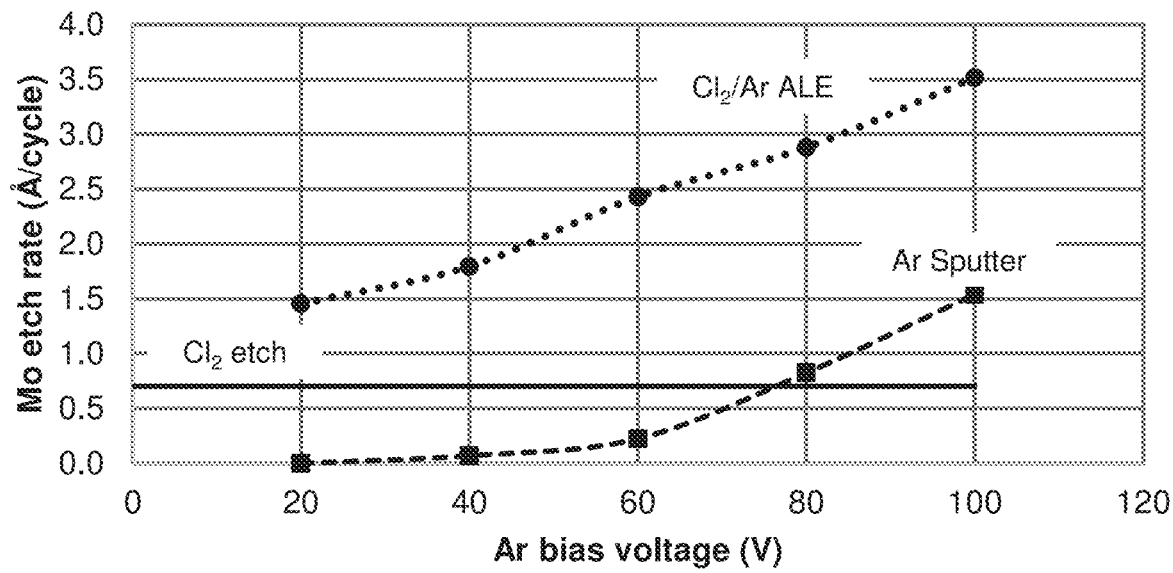
FIG. 15A shows a graph of molybdenum etch rate as a function of argon bias voltage for chlorine exposure, argon sputter only, and continuous atomic layer etching.

Molybdenum was etched using ALE with continuous Ar bias for various bias voltages used during removal and etch rates were measured. FIG. 15A shows a graph depicting the etch per cycle of argon sputtering only (labeled Ar sputter), and chlorine exposure only (labeled $Cl_2$ only), and ALE using alternating exposures of chlorine and inert argon plasma (labeled $Cl_2$/Ar ALE). The optimal bias voltage is depicted to be about 60 V.

Figure 15B:
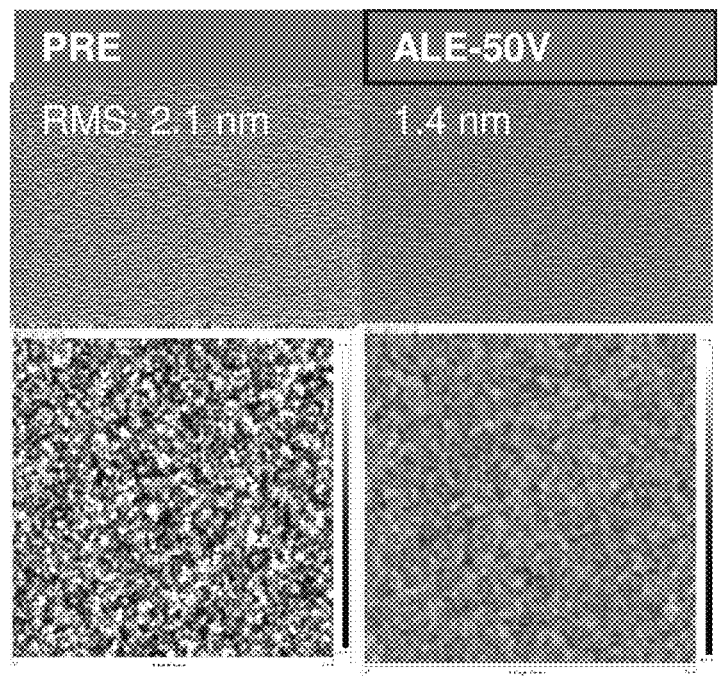
FIG. 15B shows images of a surface of molybdenum before and after atomic layer etching.

The roughness before and after ALE was observed; the results are shown in FIG. 15B, which shows one set of photos labeled "PRE" for before ALE, which has a roughness of 2.1 nm, and one set of photos labeled "ALE-50V" for after ALE performed at about 50 V of bias power during removal, which resulted in a roughness of about 1.4 nm. These results suggest that performing ALE not only etches the material but also smoothens it.

Figure 15C:
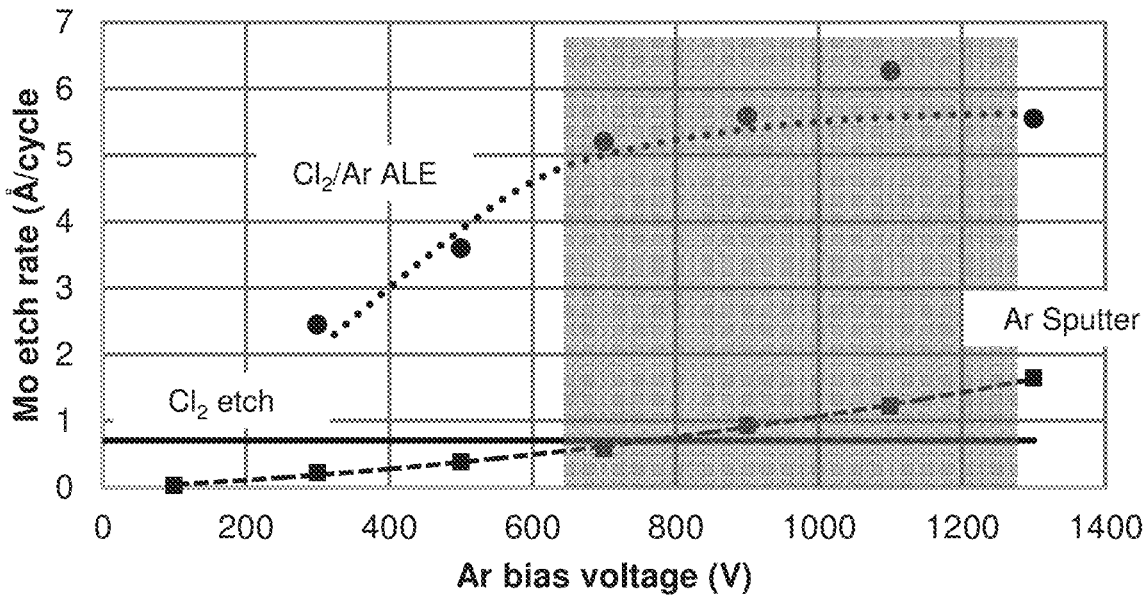
FIG. 15C shows a graph of molybdenum etch rate as a function of argon bias voltage for chlorine exposure, argon sputter only, and pulsed atomic layer etching.

Molybdenum was etched using pulsed ALE and an "ALE window" for various bias voltages used during removal was obtained. FIG. 15C shows a graph depicting the etch per cycle of argon sputtering only (labeled Ar sputter), chlorine exposure only (labeled $Cl_2$ only), and ALE using alternating exposures of chlorine and pulsed inert argon plasma using a duty cycle of 10% (labeled ALE) at 40° C. The optimal window achieved is between 600 V and 1200 V. The ALE synergy was increased to 75% (compared to about 60% synergy with continuous ALE). Pulsed ALE can also result in faster etch rates such that the etch rate is about 5-6 Å per cycle compared to 2-3 Å per cycle in continuous ALE.

Figure 15D:
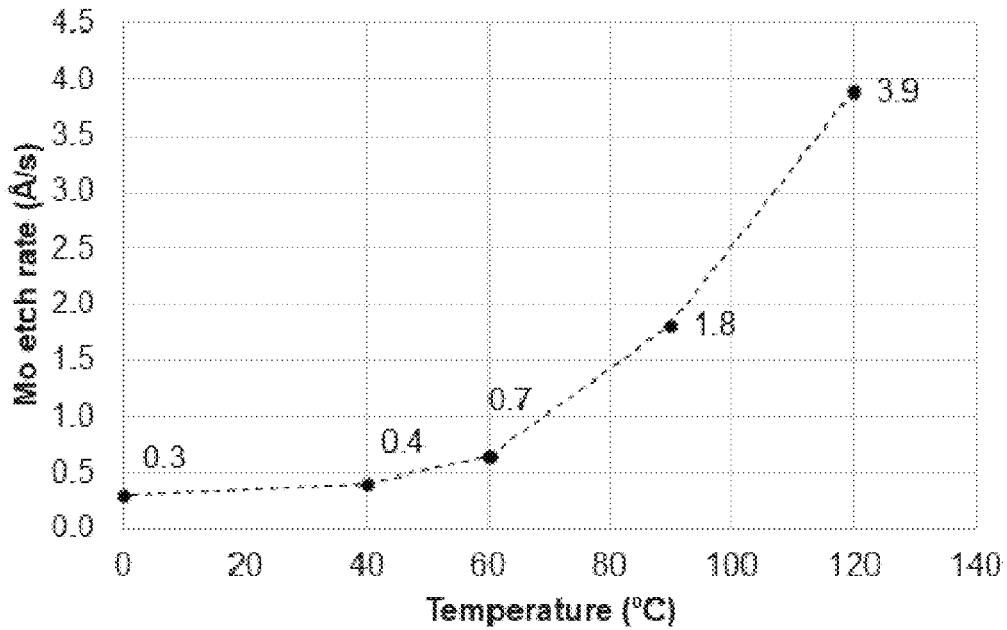
FIG. 15D shows a graph of molybdenum etch rate as a function of temperature using chlorine only.

Molybdenum was exposed to chlorine only to show the intrinsic effect of removal of molybdenum by exposure to chlorine only without sputtering for continuous exposure. The results are shown in FIG. 15D, which shows that there may be some molybdenum removal by chlorine only, and at some temperatures, may etch quickly; thus, in some cases, lower temperatures may be used to control self-limiting aspects of ALE.

F. CONCLUSION

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method for atomic layer etching a metal containing layer where the metal containing layer comprises at least one of ruthenium and molybdenum, comprising:
    a) forming a patterned mask over the metal containing layer, wherein part of the metal containing layer is exposed by the patterned mask wherein part of the metal containing layer is covered by the patterned mask and is unexposed by the patterned mask;
    b) modifying at least a region of a surface of the metal containing layer exposed by the patterned mask to form a modified metal containing region comprising at least one of ruthenium oxide and molybdenum oxide by exposing a surface of the metal containing layer to an oxygen containing modification gas, wherein part of the metal containing layer that is unexposed by the patterned mask remains an unmodified metal containing region; and
    c) selectively removing the modified metal containing region with respect to the unmodified metal containing region by exposing the surface of the metal containing layer to an inert bombardment plasma generated from an inert gas to remove the at least one of ruthenium oxide and molybdenum oxide.

2. The method, as recited in claim 1, wherein the metal containing layer comprises ruthenium.

3. The method, as recited in claim 1, wherein the metal containing layer is selectively etched with respect to the patterned mask to form features within the metal containing layer.

4. The method, as recited in claim 3, wherein the features have a width of less than 10 nm.

5. The method, as recited in claim 3, wherein the features are vias, wherein the vias have a line width roughness of less than about 2 nm.

6. The method, as recited in claim 1, wherein the exposing the surface of the metal containing layer to an inert plasma does not remove the unmodified metal containing region.

7. The method, as recited in claim 1, wherein the exposing the surface of the metal containing layer to the modification gas does not etch the metal containing layer.

8. A method for atomic layer etching a metal containing layer, comprising:
    a) modifying at least a region of a surface of the metal containing layer to form a modified metal containing region by exposing a surface of the metal containing layer to a modification gas, wherein adjacent to the modified metal containing region remains an unmodified metal containing region; and
    b) selectively removing the modified metal containing region with respect to the unmodified metal containing region by exposing the surface of the metal containing layer to an inert bombardment plasma generated from an inert gas, wherein the metal containing layer is over a patterned mask wherein the patterned mask forms a plurality of features and wherein the metal containing layer fills the plurality of features, and wherein a first plurality of the plurality of features is narrower than a second plurality of the plurality of features, and wherein the etching the metal containing layer etches back parts of the metal containing layer filling the plurality of features.

9. The method, as recited in claim 8, wherein the metal containing layer filling the first plurality of the plurality of features is etched back at a same rate as the metal containing layer filling the second plurality of the plurality of features and wherein the features have a nonuniformity of a line of less than 5 nm.

* * * * *